US012399583B2

(12) United States Patent
Cho

(10) Patent No.: US 12,399,583 B2
(45) Date of Patent: Aug. 26, 2025

(54) TOUCH DETECTION MODULE AND DISPLAY DEVICE INCLUDING THE SAME

(71) Applicant: SAMSUNG DISPLAY CO., LTD., Yongin-si (KR)

(72) Inventor: Ma Eum Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 44 days.

(21) Appl. No.: 18/335,356

(22) Filed: Jun. 15, 2023

(65) Prior Publication Data

US 2024/0094838 A1  Mar. 21, 2024

(30) Foreign Application Priority Data

Sep. 20, 2022  (KR) .................. 10-2022-0118391

(51) Int. Cl.
*G06F 3/044* (2006.01)
*G06F 3/041* (2006.01)
*H10K 59/40* (2023.01)

(52) U.S. Cl.
CPC .......... *G06F 3/0412* (2013.01); *G06F 3/0416* (2013.01); *G06F 3/0446* (2019.05); *H10K 59/40* (2023.02)

(58) Field of Classification Search
CPC .... G06F 3/0412; G06F 3/0416; G06F 3/0446; G06F 2203/04111; G06F 3/04164; G06F 3/0443; G06F 3/046; H10K 59/40; H10K 50/844; G02F 1/13338
See application file for complete search history.

(56) References Cited

U.S. PATENT DOCUMENTS

| | | | | |
|---|---|---|---|---|
| 9,760,218 B2* | 9/2017 | Lu | ......................... | G06F 3/0446 |
| 11,054,955 B2* | 7/2021 | Naganuma | ............ | G06F 3/0445 |
| 12,032,777 B2* | 7/2024 | Kim | ...................... | G06F 3/0412 |
| 2014/0247226 A1* | 9/2014 | Chiu | ...................... | G06F 3/0443 |
| | | | | 427/595 |
| 2016/0117031 A1* | 4/2016 | Han | ...................... | G06F 3/0412 |
| | | | | 345/174 |
| 2017/0308212 A1* | 10/2017 | Jin | ........................ | H10K 59/131 |
| 2018/0143711 A1* | 5/2018 | Ono | ..................... | G02F 1/13338 |
| 2020/0117313 A1* | 4/2020 | Zhang | ................... | G06F 3/0446 |
| 2021/0226156 A1* | 7/2021 | Chen | ...................... | H10K 50/84 |
| 2022/0382432 A1* | 12/2022 | Yan | ........................ | G06F 3/0448 |

FOREIGN PATENT DOCUMENTS

| | | |
|---|---|---|
| CN | 108598290 | 5/2022 |
| KR | 10-2020-0071189 | 6/2020 |
| KR | 10-2020-0073338 | 6/2020 |
| KR | 10-2303214 | 9/2021 |

* cited by examiner

*Primary Examiner* — Bryan Earles
(74) *Attorney, Agent, or Firm* — F. CHAU & ASSOCIATES, LLC

(57) ABSTRACT

The present disclosure relates to a touch detection module and a display device. According to an embodiment of the disclosure, a touch detection module comprising a plurality of driving electrodes arranged in parallel in a touch sensing area, a plurality of sensing electrodes crossing the plurality of driving electrodes, a plurality of driving lines arranged in a touch peripheral area of the touch sensing area to supply a touch driving signal to the plurality of driving electrodes, a plurality of sensing lines arranged in the touch peripheral area to transmit sensing signals from the plurality of sensing electrodes, and a plurality of through holes formed in the touch peripheral area.

18 Claims, 24 Drawing Sheets

TOUCH DETECTION MODULE AND DISPLAY DEVICE INCLUDING THE SAME

CROSS-REFERENCE TO RELATED APPLICATION

This application claims priority from Korean Patent Application No. 10-2022-0118391 filed on Sep. 20, 2022 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to a touch detection module and a display device including the same.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Display devices may be flat panel display devices such as a liquid-crystal display device, a field emission display device, and an organic light-emitting display device. Among such flat panel display devices, a light-emitting display device includes a light-emitting element that can emit light on its own, so that each of the pixels of the display panel can emit light by themselves. Accordingly, a light-emitting display device can display images without a backlight unit that supplies light to the display panel.

Recently, a display device includes a touch detection module for sensing a user's touch as one of interface means. A touch detection module includes a touch detecting unit in which touch electrodes are arranged, and a touch driving circuit that detects an amount of charge that is charged in capacitance between the touch electrodes. The touch detection module may be integrally formed on or may be mounted on the front surface of the display device where images are displayed.

SUMMARY

Aspects of the present disclosure provide a touch detection module that forms an organic layer between the lines of the touch detecting unit to reduce the resistance between the touch lines and improve signal transmission efficiency and a display device including the same.

Aspects of the present disclosure also provide a touch detection module that can reduce floating defects of the organic layer by facilitating the discharge of gas and moisture according to the formation of the organic layer, and a display device including the same.

However, aspects of the present disclosure are not restricted to those set forth herein. The above and other aspects of the present disclosure will become more apparent to an ordinary skilled person in the art to which the present disclosure pertains by referencing the detailed description of the present disclosure given below.

According to an embodiment of the disclosure, a touch detection module includes a plurality of driving electrodes arranged in parallel in a touch sensing area, a plurality of sensing electrodes crossing the plurality of driving electrodes, a plurality of driving lines arranged in a touch peripheral area surrounding the touch sensing area to supply a touch driving signal to the plurality of driving electrodes, a plurality of sensing lines arranged in the touch peripheral area to transmit sensing signals from the plurality of sensing electrodes, and a plurality of through holes formed in a subsidiary area extending from the touch peripheral area. A first portion of the touch peripheral area is disposed between the subsidiary area and the touch sensing area.

In an embodiment, the touch detection module further includes a first touch insulating layer disposed in the subsidiary area, and a second touch insulating layer disposed on the first touch insulating layer and disposed in the subsidiary area. The plurality of sensing lines are disposed at a first sensing line distance on at least one of the first touch insulating layer and the second touch insulating layer in the subsidiary area. The plurality of driving lines are disposed at a first driving line distance on at least one of the first touch insulting layer and the second touch insulting layer in the subsidiary area. The plurality of through holes are formed to penetrate the second touch insulating layer.

In an embodiment, the second touch insulating layer is formed of an organic insulating layer including at least one of organic material among an acryl resin, an epoxy resin, a phenolic resin, a polyamide resin, a polyimide resin, a methacrylic resin, a polyisoprene, a vinyl resin, a urethane resin, a cellulose resin, a siloxane resin, a perylene resin, and a zirconia.

In an embodiment, at least one of a height and a width of the second touch insulating layer is greater than a corresponding one of a height and a width of the first touch insulating layer. The first touch insulating layer includes at least one inorganic material layer among a silicon nitride layer, a silicon oxynitride layer, a silicon oxide layer, titanium oxide layer, and an aluminum oxide layer.

In an embodiment, the touch detection module further includes a pad unit disposed in the subsidiary area. The plurality of sensing lines extend along a first side of the touch peripheral area and extend along a lower side of the touch sensing area. The lower side of the touch sensing area is adjacent to the subsidiary area. The plurality of through holes are disposed in spaces between two adjacent sensing lines of the plurality of sensing lines that are disposed in the subsidiary area. The plurality of through holes are disposed in a region between the first portion of the touch peripheral area and the pad unit.

In an embodiment, the plurality of driving lines extend along a second side, opposite to the first side, of the touch peripheral area. The plurality of through holes are further disposed in spaces between two adjacent driving lines of the plurality of driving lines that are disposed in the subsidiary area.

In an embodiment, the first driving line distance and the first sensing line distance are the same. The first driving line distance is greater than a width of each driving line of the plurality of driving lines.

In an embodiment, the plurality of through holes include two first through holes spaced apart from each other at a first interval in a first direction, and two second through holes spaced apart from each other at a second interval in a second direction different from the first direction. At least one of the plurality of driving lines and sensing lines is interposed in a space between the two first through holes. The two second through holes are disposed in a space between adjacent two lines among the plurality of driving lines and sensing lines. The first interval and the second interval are the same.

In an embodiment, the first driving line distance and the first sensing line distance are the same. A width or an inner diameter of each of the plurality of through holes is narrower than the first driving line distance.

In an embodiment, a width or an inner diameter of each of the plurality of through holes is the same as a width of each of the plurality of driving lines or a width of each of the plurality of sensing lines.

In an embodiment, The plurality of through holes includes two first through holes spaced apart from each other at a first interval in a first direction, and two second through holes spaced apart from each other at a second interval in a second direction different from the first direction. At least two lines among the plurality of driving lines and sensing lines are interposed between the two first through holes. The two second through holes are disposed in a space between adjacent two lines among the plurality of driving lines and sensing lines. The second interval is narrower than the first interval.

In an embodiment, the plurality of through holes are disposed by a second interval between the plurality of driving lines, between the plurality of sensing lines, or between the driving line and the sensing line, the plurality of through holes disposed by a third interval with at least two lines among the plurality of driving lines and sensing lines disposed therebetween, and wherein a width of the plurality of through holes is formed to be wider than the third interval.

In an embodiment, the plurality of through holes includes two first through holes spaced apart from each other at a first interval in a first direction, and two second through holes spaced apart from each other at a second interval in a second direction different from the first direction. At least two lines among the plurality of driving lines and sensing lines are interposed between the two first through holes. The two second through holes are disposed in a space between adjacent two lines among the plurality of driving lines and sensing lines. The second interval is wider than the first interval.

According to an embodiment of the disclosure, a display device includes a display panel comprising a display area in which a plurality of pixels are arranged and a touch detection module disposed on a front surface of the display panel to detect a user's touch. The touch detection module includes a plurality of driving electrodes arranged in parallel in a touch sensing area, a plurality of sensing electrodes crossing the plurality of driving electrodes, a plurality of driving lines arranged in a touch peripheral area surrounding the touch sensing area to supply a touch driving signal to the plurality of driving electrodes, a plurality of sensing lines arranged in the touch peripheral area to transmit touch sensing signals from the plurality of sensing electrodes, a plurality of through holes formed in a subsidiary area extending from the touch peripheral area, wherein a first portion of the touch peripheral area is disposed between the subsidiary area and the touch sensing area, and a touch driving circuit receiving the touch sensing signals to detect a touch position coordinate on the display area.

In an embodiment, the touch detection module further includes a first touch insulating layer disposed in the subsidiary area, and a second touch insulating layer disposed on the first touch insulating layer and disposed in the subsidiary area. The plurality of sensing lines are disposed at a first sensing line distance on at least one of the first touch insulating layer and the second touch insulating layer in the subsidiary area. The plurality of driving lines are disposed at a first driving line distance on at least one of the first touch insulating layer and the second touch insulating layer in the subsidiary area. The plurality of through holes penetrate the second touch insulating layer.

In an embodiment, the touch detection module further includes a pad unit disposed in the subsidiary area. The plurality of sensing lines extend along a first side of the touch peripheral area and extend along a lower side of the touch sensing area. The lower side of the touch sensing area is adjacent to the subsidiary area. The plurality of through holes are disposed in spaces between two adjacent sensing lines of the plurality of sensing lines that are disposed in the subsidiary area. The plurality of through holes are disposed in a region between the first portion of the touch peripheral area and the pad unit.

In an embodiment, the plurality of driving lines extend along a second side, opposite to the first side, of the touch peripheral area. The plurality of through holes are further disposed in spaces between two adjacent driving lines of the plurality of driving lines that are disposed in the subsidiary area.

In an embodiment, the first driving line distance and the first sensing line distance are the same. The first driving line distance is greater than a width of each driving line of the plurality of driving lines.

In an embodiment, the plurality of through holes includes two first through holes spaced apart from each other at a first interval in a first direction, and two second through holes spaced apart from each other at a second interval in a second direction different from the first direction. At least two lines among the plurality of driving lines and sensing lines are interposed between the two first through holes. The two second through holes are disposed in a space between adjacent two lines among the plurality of driving lines and sensing lines. The second interval is narrower than the first interval.

In an embodiment, the plurality of through holes includes two first through holes spaced apart from each other at a first interval in a first direction, and two second through holes spaced apart from each other at a second interval in a second direction different from the first direction. At least two lines among the plurality of driving lines and sensing lines are interposed between the two first through holes. The two second through holes are disposed in a space between adjacent two lines among the plurality of driving lines and sensing lines. The second interval is wider than the first interval.

According to embodiments of the present disclosure, an organic layer may be formed between the lines of the touch detecting unit to reduce the resistance between the touch lines and improve signal transmission efficiency.

In addition, according to one embodiment of the present disclosure, the discharge of gas and moisture may be facilitated according to the formation of the organic layer to reduce the floating defects of the organic layer and improve production yield of the touch detection module.

However, the effects of the present disclosure are not restricted to the one set forth herein. The above and other effects of the present disclosure will become more apparent to an ordinary skilled person in the art to which the present disclosure pertains by referencing the claims.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

Figure 1:
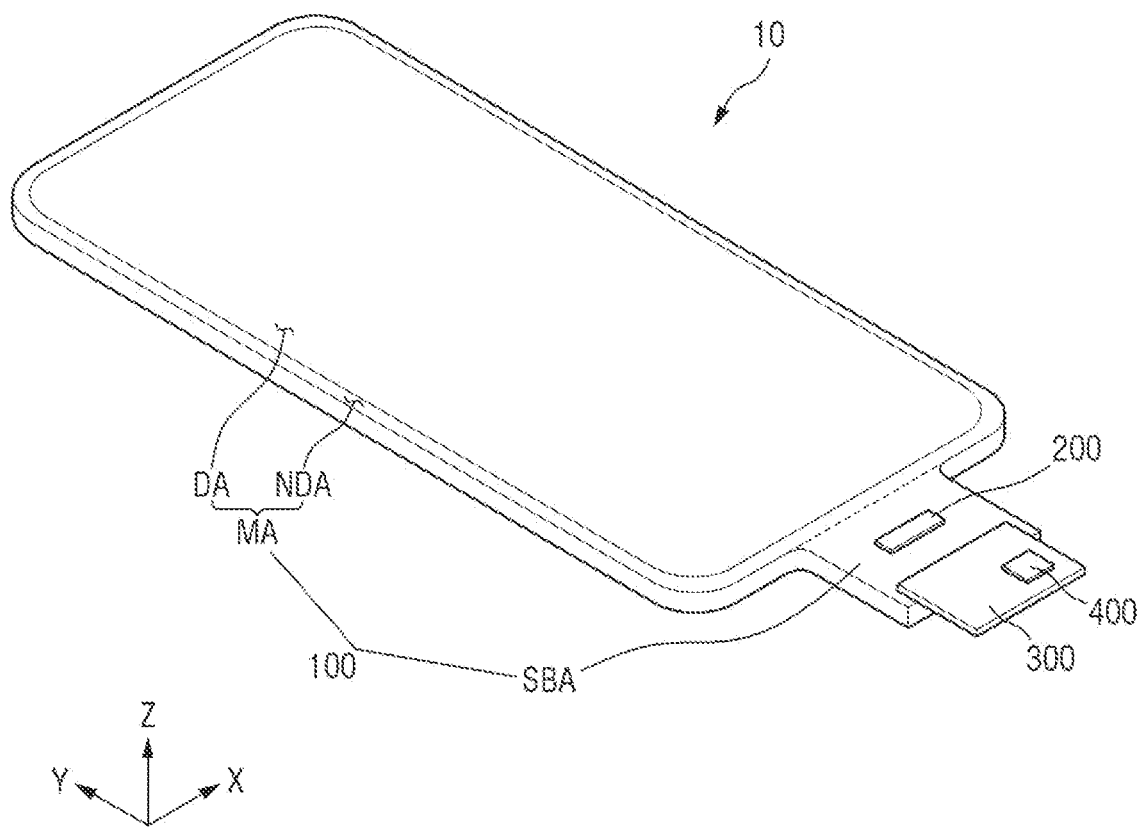
FIG. 1 is a perspective view of a display device according to an embodiment of the present disclosure.
Figure 2:
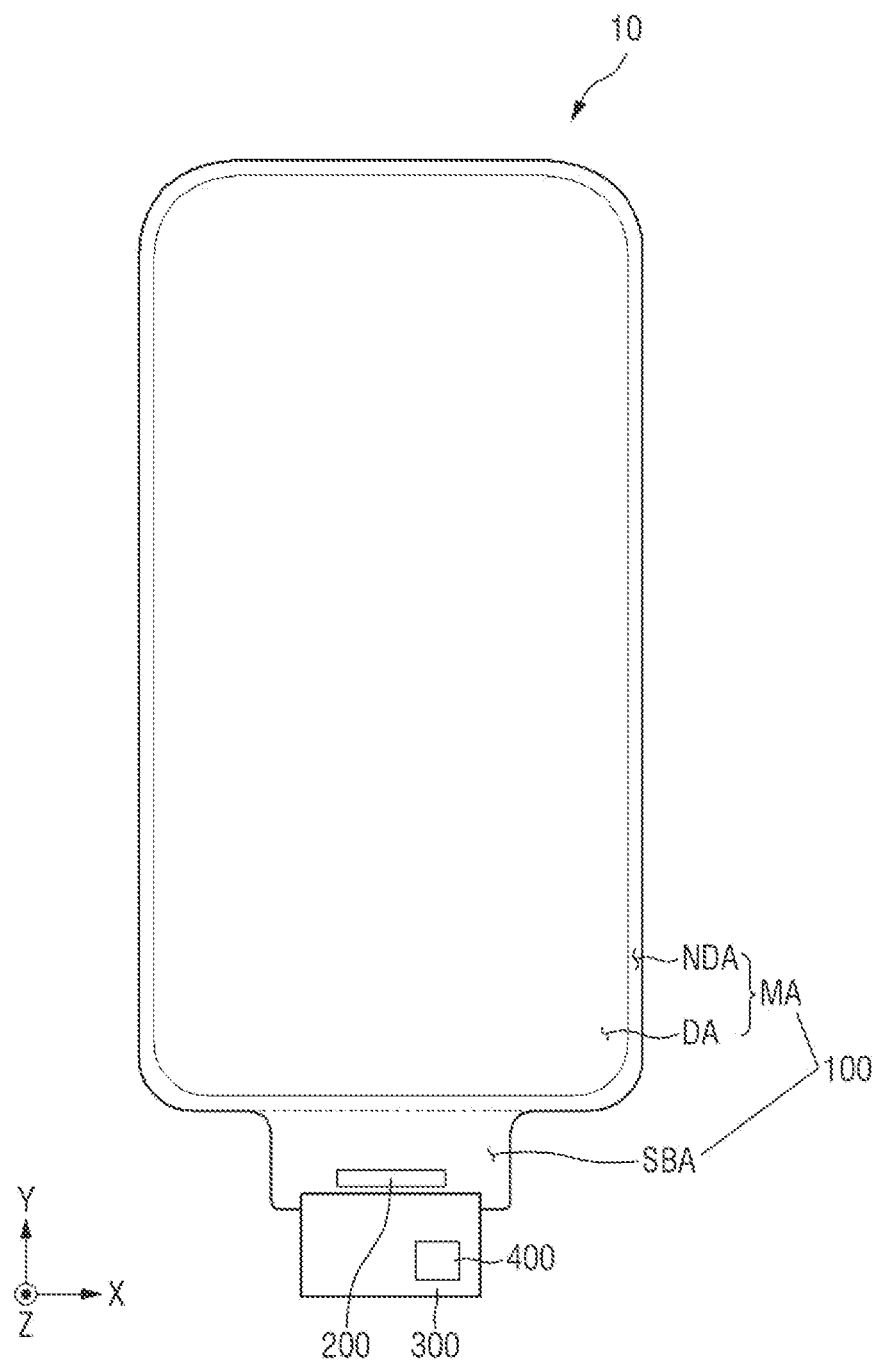
FIG. 2 is a plan view of a display device according to an embodiment of the present disclosure.
Figure 3:
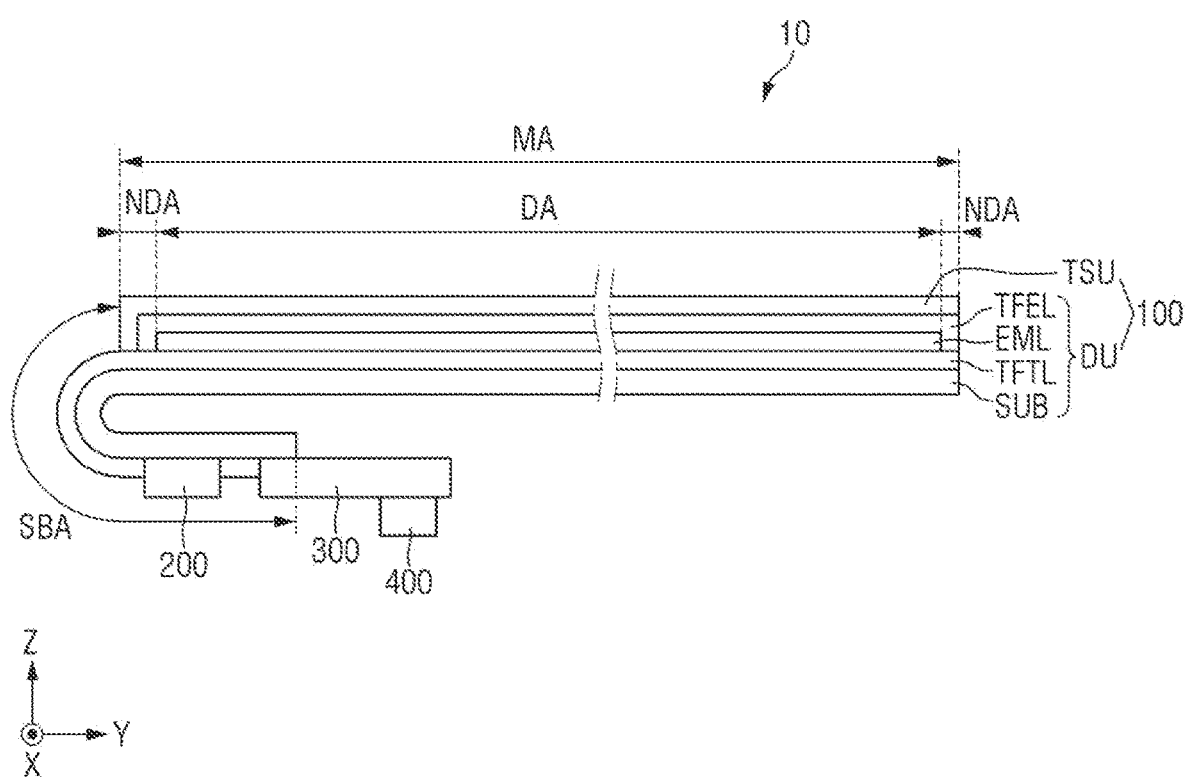
FIG. 3 is a side view of a display device according to an embodiment of the present disclosure.

FIG. 1 is a perspective view of a display device according to an embodiment. FIG. 2 is a plan view of a display device according to an embodiment. FIG. 3 is a side view of a display device according to an embodiment.

Referring to FIGS. 1 to 3, a display device 10 according to an embodiment of the disclosure may be employed by portable electronic devices such as a mobile phone, a smart phone, a tablet PC, a mobile communications terminal, an electronic notebook, an electronic book, a portable multimedia player (PMP), a navigation device, and an ultra mobile PC (UMPC). Also, the display device 10 according to an embodiment may be applied as a display unit of a television, a laptop computer, a monitor, a billboard, or the Internet of Things (JOT). In addition, the display device 10 according to an embodiment may be applied to a wearable device such as a smart watch, a watch phone, a glasses-type display, and a head mounted display (HMD). Alternatively, the display device 10 according to an embodiment may be applied to a dashboard of a vehicle, a center fascia of the vehicle, a center information display (CID) disposed on a dashboard of the vehicle, a rearview mirror display instead of a side mirror of the vehicle (a room mirror display), or may be applied to a display disposed on the back of the front seat as entertainment for the rear seat of a car.

According to an embodiment of the present disclosure, the display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and an ultra-small light-emitting display device using micro or nano light-emitting diodes (micro LEDs or nano LEDs). In the following description, an organic light-emitting display device is described as an example of the display device 10 according to the embodiment. It is, however, to be understood that the present disclosure is not limited thereto.

According to the embodiment of the disclosure, the display device 10 includes a display panel 100, a display driving circuit 200, a display circuit board 300, and a touch driving circuit 400.

The display panel 100 may be formed in a rectangular plane having shorter sides in a first direction (x-axis direction) and longer sides in a second direction (y-axis direction) intersecting the first direction (x-axis direction). Each of the corners where the short side in the first direction (x-axis direction) meets the longer side in the second direction (y-axis direction) may be rounded with a predetermined curvature or may be a right angle. The shape of the display panel 100 when viewed from the top is not limited to a quadrangular shape, but may be formed in a different polygonal shape, a circular shape, or an elliptical shape. The display panel 100 may be formed flat, but is not limited thereto. For example, the display panel 100 includes curved portions formed at left and right ends and having a constant curvature or a varying curvature. In addition, the display panel 100 may be formed to be flexible so that it can be curved, bent, folded or rolled.

The display panel 100 includes a main area MA and a subsidiary area SBA.

The main area MA includes a display area DA where images are displayed, and a non-display area NDA around the display area DA. The display area DA includes pixels for displaying images. The subsidiary area SBA may protrude from one side of the main area MA in the second direction (y-axis direction). In an embodiment, a portion of the non-display area NDA may be disposed between the display area DA and the subsidiary area SBA.

Although the subsidiary area SBA is unfolded in the example shown in FIGS. 1 and 2, the subsidiary area SBA may be bent as shown in FIG. 3 and may be disposed on the lower surface of the display panel 100. When the subsidiary area SBA is bent, it may overlap the main area MA in a third direction (z-axis direction), which is the thickness direction of a substrate SUB. The display driving circuit 200 may be disposed in the subsidiary area SBA.

In addition, as shown in FIG. 3, the display panel 100 includes a display module DU including a substrate SUB, a thin-film transistor layer TFTL, an emission material layer EML, and an encapsulation layer TFEL, and a touch detecting unit TSU formed on the front surface of the display module DU.

The thin-film transistor layer TFTL may be disposed on the substrate SUB. The thin-film transistor layer TFTL may be disposed in the main area MA and the subsidiary area SBA. The thin-film transistor layer TFTL includes thin-film transistors.

The emission material layer EML may be disposed on the thin-film transistor layer TFTL. The emission material layer EML may be disposed in the display area DA of the main area MA. The emission material layer EML includes light-emitting elements disposed in emission areas.

The encapsulation layer TFEL may be disposed on the emission material layer EML. The encapsulation layer TFEL may be disposed in the display area DA and the non-display area NDA of the main area MA. The encapsulation layer TFEL includes or is formed of at least one inorganic layer and at least one organic layer for encapsulating the emission material layer.

The touch detecting unit TSU may be disposed on the encapsulation layer TFEL or be mounted on the encapsulation layer TFEL. The touch detecting unit TSU may be disposed on the display area DA of the main area MA. The touch detecting unit TSU may sense a touch of a person or an object using touch electrodes.

A cover window for protecting the display panel 100 from above may be disposed on the touch detecting unit TSU. The cover window may be attached on the touch detecting unit TSU by a transparent adhesive member such as an optically clear adhesive (OCA) film and an optically clear resin (OCR). The cover window may be an inorganic material such as glass, or an organic material such as plastic and polymer material. In order to prevent deterioration of image visibility due to reflection of external light, a polarizing film may be further disposed between the touch detecting unit TSU and the cover window.

The display driving circuit 200 may generate signals and voltages for driving the display panel 100. The display driving circuit 200 may be implemented as an integrated circuit (IC) and may be attached to the display panel 100 by a chip on glass (COG) technique, a chip on plastic (COP) technique, or an ultrasonic bonding. It is, however, to be understood that the present disclosure is not limited thereto. For example, the display driving circuit 200 may be attached on the display circuit board 300 by the chip-on-film (COF) technique.

The display circuit board 300 may be attached to one end of the subsidiary area SBA of the display panel 100. Accordingly, the display circuit board 300 may be electrically connected to the display panel 100 and the display driving circuit 200. The display panel 100 and the display driving circuit 200 may receive digital video data, timing signals, and driving voltages through the display circuit board 300. The display circuit board 300 may be a flexible printed circuit board, a printed circuit board, or a flexible film such as a chip-on film.

The touch driving circuit 400 may be disposed on the display circuit board 300. The touch driving circuit 400 may be implemented as an integrated circuit (IC) and may be attached on the display circuit board 300.

The touch driving circuit 400 may be electrically connected to the touch electrodes of the touch detecting unit TSU. The touch driving circuit 400 applies touch driving signals to the touch electrodes of the touch detecting unit TSU, and measures a change in the amount of charges stored in the mutual capacitance of each of the plurality of touch nodes formed by the touch electrodes. Specifically, the touch driving circuit 400 measures a change in capacitance of a plurality of touch nodes according to a change in a voltage or an amount of current of a touch sensing signal received through the touch electrodes. In this method, the touch driving circuit 400 may determine whether there is a user's touch or near proximity, based on the amount of a change in the mutual capacitance of each of the plurality of touch nodes. A user's touch refers to an object such as the user's finger and a pen contacting a surface of the cover window disposed on the touch detecting unit TSU. A user's near proximity refers to an object such as the user's finger and a pen hovering over a surface of the cover window.

Figure 4:
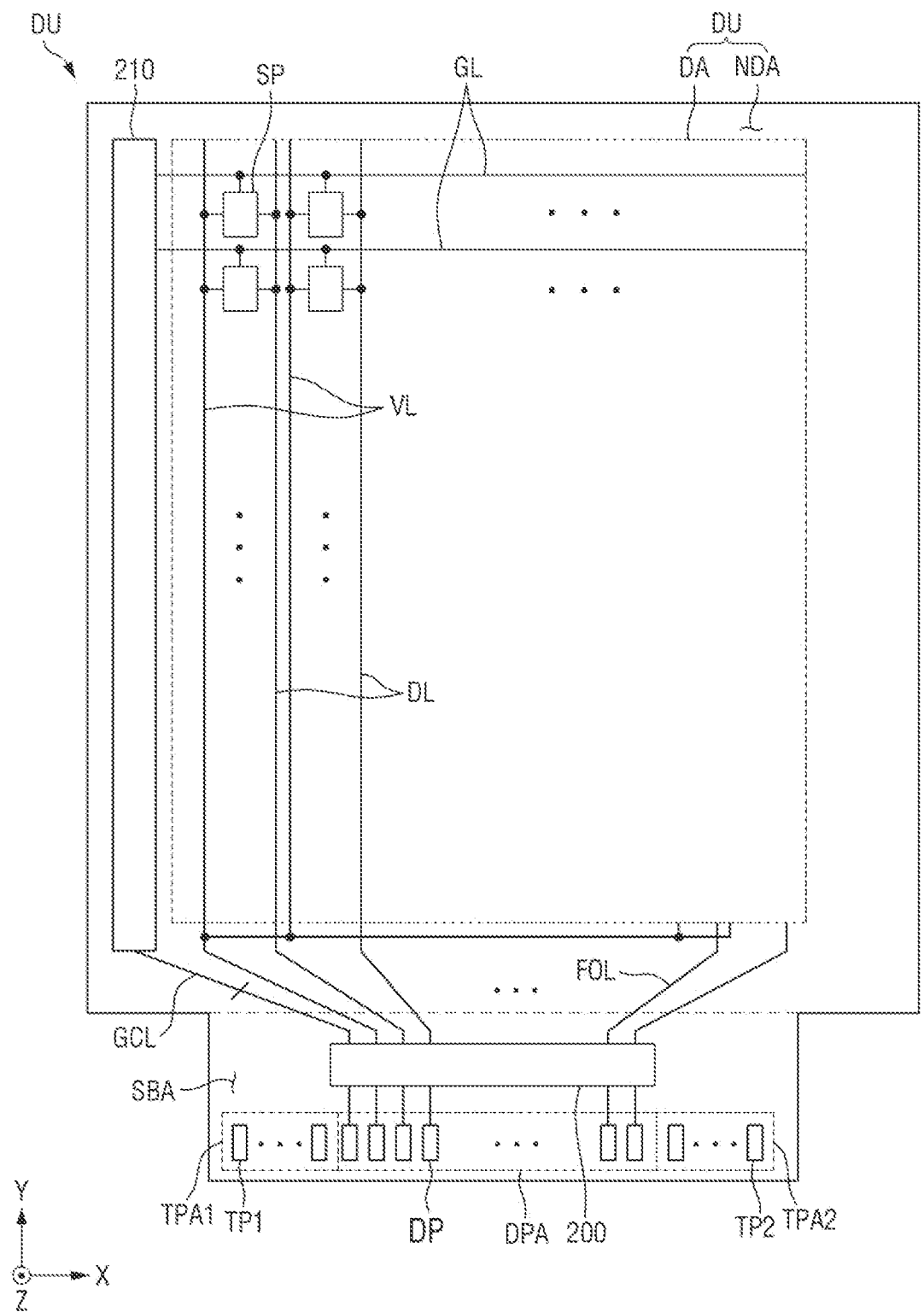
FIG. 4 is a view showing an example of a layout of a display panel illustrated in FIGS. 1 to 3 according to an embodiment of the present disclosure.

FIG. 4 is a view showing an example of a layout of a display panel shown in FIGS. 1 to 3. Specifically, FIG. 4 is a view of a layout diagram illustrating a display area DA and a non-display area NDA of a display module DU in a state before the touch detecting unit TSU is formed.

The display area DA displays images therein and may be defined as a central area of the display panel 100. The display area DA may include a plurality of pixels SP, a plurality of gate lines GL, a plurality of data lines DL and a plurality of voltage lines VL. Each of the plurality of pixels SP may be defined as the minimum unit that outputs light.

The plurality of gate lines GL may supply gate signals received from a gate driver 210 to the plurality of pixels SP. The plurality of gate lines GL may be extended in the x-axis direction and may be spaced apart from one another in the y-axis direction crossing the x-axis direction.

The plurality of data lines DL may supply the data voltages received from the display driving circuit 200 to the plurality of pixels SP. The plurality of data lines DL may be extended in the y-axis direction and may be spaced apart from one another in the x-axis direction.

The plurality of voltage lines VL may supply the supply voltage received from the display driving circuit 200 to the plurality of pixels SP. The supply voltage may be at least one of a driving voltage, an initialization voltage, and a reference voltage. The plurality of voltage lines VL may be extended in the y-axis direction and may be spaced apart from one another in the x-axis direction.

The non-display area NDA may surround the display area DA. The non-display area NDA may include the gate driver 210, fan-out lines FOL, and gate control lines GCL. The gate driver 210 may generate a plurality of gate signals based on the gate control signal, and may sequentially supply the plurality of gate signals to the plurality of gate lines GL in a predetermined order.

The fan-out lines FOL may be extended from the display driving circuit 200 to the display area DA. The fan-out lines FOL may supply the data voltage received from the display driving circuit 200 to the plurality of data lines DL.

The gate control line GCL may be extended from the display driving circuit 200 to the gate driver 210. The gate control line GCL may supply the gate control signal received from the display driving circuit 200 to the gate driver 210.

The subsidiary area SBA may include the display driving circuit 200, the display pad area DPA, and first and second touch pad areas TPA1 and TPA2.

The display driving circuit 200 may output signals and voltages for driving the display panel 100 to the fan-out lines FOL. The display driving circuit 200 may supply data voltages to the data lines DL through the fan-out lines FOL. The data voltages may be applied to the plurality of pixels SP, so that the luminance of the plurality of pixels SP may be determined. The display driving circuit 200 may supply a gate control signal to the gate driver 210 through the gate control line GCL.

The display pad area DPA, the first touch pad area TPA1 and the second touch pad area TPA2 may be disposed on the edge of the subsidiary area SBA. The display pad area DPA, the first touch pad area TPA1 and the second touch pad area TPA2 may be electrically connected to the display circuit board 300 using a low-resistance, high-reliability material such as an anisotropic conductive film and a semi-additive process (SAP).

The display pad area DPA may include a plurality of display pads. The plurality of display pads may be connected to the display driving circuit 200 or the touch driving circuit 400 through the display circuit board 300. The plurality of display pads may be connected to the display circuit board 300 to receive digital video data and may supply digital video data to the display driving circuit 200.

Figure 5:
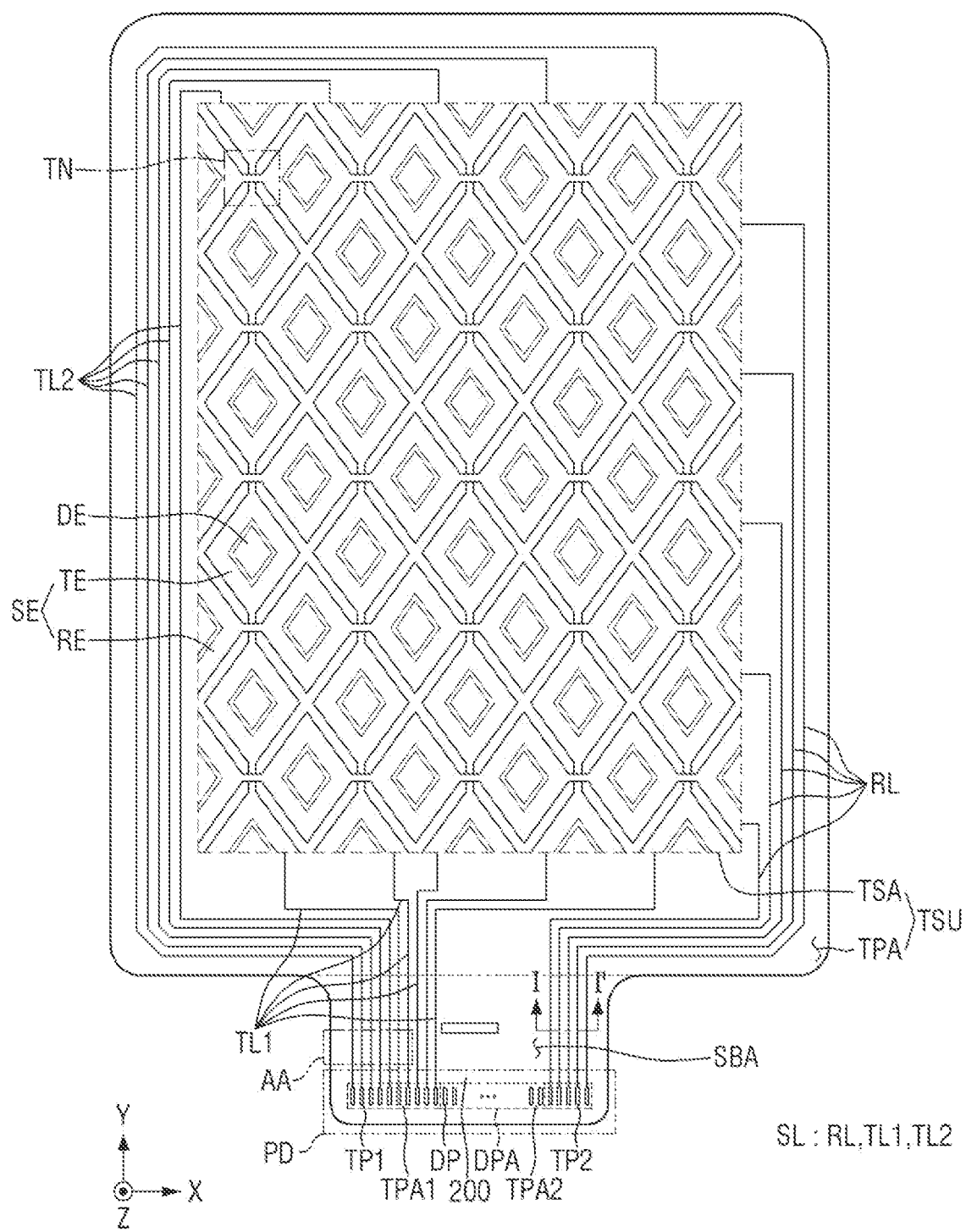
FIG. 5 is a view showing an example of a layout of a touch detection module illustrated in FIG. 3 according to an embodiment of the present disclosure.

FIG. 5 is a view showing an example of a layout of a touch detection module illustrated in FIG. 3.

FIG. 5 mainly illustrates the touch electrodes SE of the main area MA including two types of electrodes, for example, driving electrodes TE and sensing electrodes RE, and a mutual capacitance method in which a touch driving signal is applied to the driving electrodes TE and then a charge change amount of a mutual capacitance of each touch node TN is sensed through the sensing electrodes RE. However, the type and arrangement structure of the touch electrodes SE and the driving method of the touch electrodes SE are not limited to the capacitive sensing method.

For convenience of illustration, FIG. 5 shows only the driving electrodes TE, the sensing electrodes RE, dummy patterns DE, touch lines SL, and first and second touch pads TP1 and TP2.

Referring to FIG. 5, the main area MA of the touch detecting unit TSU includes a touch sensing area TSA for sensing a user's touch, and a touch peripheral area TPA disposed around the touch sensing area TSA. The touch sensing area TSA may overlap the display area DA of FIGS. 1 to 3, and the touch peripheral area TPA may overlap the non-display area NDA. In some embodiments, the touch peripheral area TPA may surround the touch sensing area TSA. In an embodiment, the subsidiary area SBA may extend from a portion of the touch peripheral area TPA, and the portion of the touch peripheral area TPA may be disposed between the subsidiary area SBA and the touch sensing area TSA.

In the touch sensing area TSA, the driving electrodes TE, the sensing electrodes RE and the dummy patterns DE are disposed. The driving electrodes TE and the sensing electrodes RE may be electrodes for forming mutual capacitance to sense a touch of an electronic pen or a person.

The driving electrodes TE may be arranged in the first direction (x-axis direction) and second direction (y-axis direction). The driving electrodes TE adjacent to one another in the first direction (x-axis direction) may be electrically separated from one another, and the driving electrodes TE adjacent to one another in the second direction (y-axis direction) may be electrically connected to one another. The driving electrodes TE adjacent to one another in the second direction (y-axis direction) may be connected through separated connection electrodes.

The sensing electrodes RE may be arranged in the first direction (x-axis direction) and second direction (y-axis direction). The sensing electrodes RE adjacent to one another in the first direction (x-axis direction) may be electrically connected to one another in the first direction (x-axis direction). In addition, the sensing electrodes RE adjacent to one another in the second direction (y-axis direction) may be electrically separated from one another. Accordingly, touch nodes TN where mutual capacitance is formed may be formed at intersections of the driving electrodes TE and the sensing electrodes RE. The plurality of touch nodes TN may be associated with the intersections of the driving electrodes TE and the sensing electrodes RE, respectively.

Each of the dummy patterns DE may be surrounded by the driving electrode TE or the sensing electrode RE. Each of the dummy patterns DE may be electrically separated from the driving electrode TE or the sensing electrode RE. Each of the dummy patterns DE may be spaced apart from the driving electrode TE or the sensing electrode RE. Each of the dummy patterns DE may be electrically floating.

In FIG. 5, the driving electrodes TE, the sensing electrodes RE and the dummy patterns DE each have a diamond shape when viewed from the top, but the present disclosure is not limited thereto. For example, each of the driving electrodes TE, the sensing electrodes RE and the dummy patterns DE may have a quadrangular shape other than the diamond shape, polygonal shapes other than the quadrangular shape, a circular shape or an elliptical shape when viewed from the top.

Touch lines SL may be disposed in the peripheral area of the touch sensing area TSA, that is, a touch peripheral area TPA. The touch lines SL include first and second touch driving lines TL1 and TL2 connected to the driving electrodes TE, and the touch sensing lines RL connected to the sensing electrodes RE.

The sensing electrodes RE disposed on one side of the touch sensing area TSA may be connected to the touch sensing lines RL, respectively. For example, some of the sensing electrodes RE electrically connected in the first direction (x-axis direction) that are disposed at the right end may be connected to the touch sensing lines RL, respectively, as shown in FIG. 5. In addition, each of the touch sensing lines RL may be connected to a pad unit PD via a portion of the touch peripheral area TPA. For example, each of the touch sensing lines RL may be connected on a one-to-one basis to the second touch pads TP2 disposed on the pad unit PD via the right outer side of the touch sensing area TSA.

The driving electrodes TE disposed at one end of the touch sensing area TSA may be connected to the first touch driving lines TL1, respectively, while the driving electrodes TE disposed at the opposite end of the touch sensing area TSA may be connected to the second touch driving lines TL2, respectively. For example, some of the driving electrodes TE electrically connected to one another in the second direction (y-axis direction) that are disposed at the lower end may be connected to the first touch driving lines TL1, respectively, while some of the driving electrodes TE disposed at the upper end may be connected to the second touch driving lines TL2, respectively.

The first or second touch driving lines TL1 and TL2 may be connected to the pad unit PD formed in the subsidiary area SBA of the display panel 100 via a portion of the touch peripheral area TPA. For example, the second touch driving lines TL2 may be connected to the driving electrodes TE on the upper side of the touch sensing area TSA via the left outer side of the touch sensing area TSA. In addition, the first and second touch driving lines TL1 and TL2 may be connected to the pad unit PD formed in the subsidiary area SBA under the touch sensing area TSA. In this case, the first and second touch driving lines TL1 and TL2 may be connected one-to-one basis to the first touch pads TP1 disposed on the pad unit PD.

The driving electrodes TE are connected to the first and second touch driving lines TL1 and TL2 on both sides of the touch sensing area TSA to receive an input of touch driving signals through the first and second touch driving lines TL1 and TL2 on both sides. Accordingly, it is possible to prevent a difference from occurring between touch driving signal applied to the driving electrodes TE disposed below the touch sensing area TSA due to the RC delay of the touch driving signal and the touch driving signals applied to the driving electrodes TE disposed above the touch sensing area TSA.

As shown in FIGS. 1 to 3, when the display circuit board 300 is connected to one side of the flexible film, the display pad area DPA and the first and second touch pad areas TPA1 and TPA2 of the pad unit PD may be associated with pads of the display panel 100 connected to the display circuit board 300. Accordingly, the pads of the display panel 100 may be in contact with the display pads DP, the first touch pads TP1 and the second touch pads TP2. The display pads DP, the first touch pads TP1 and the second touch pads TP2 may be electrically connected to the pads of the display circuit board 300 using a low-resistance, high-reliability material such as an anisotropic conductive film and a SAP.

Therefore, the display pads DP, the first touch pads TP1 and the second touch pads TP2 may be electrically connected to the touch driving circuit 400 disposed on the display circuit board 300.

Figure 6:
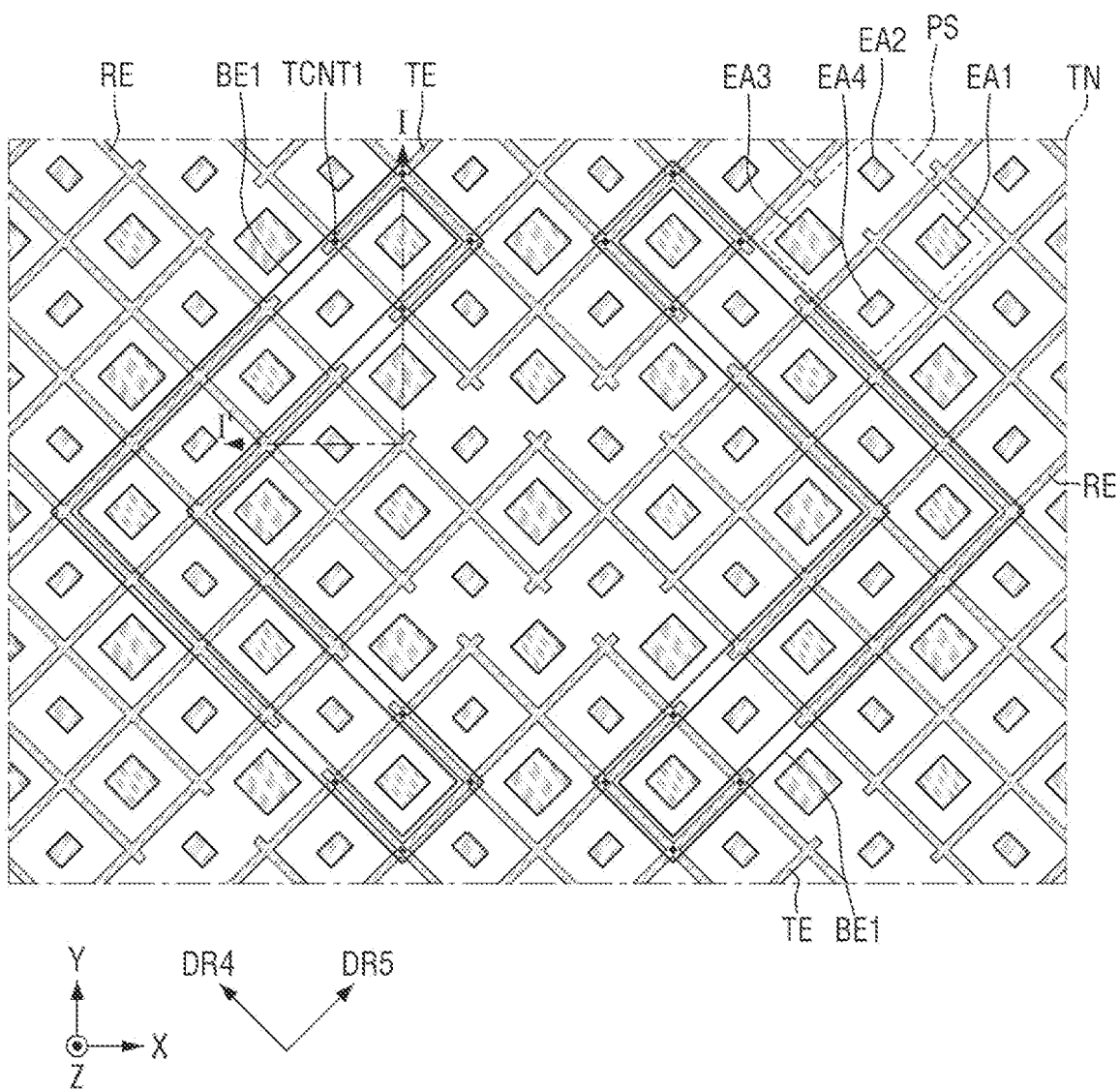
FIG. 6 is an enlarged plan view specifically illustrating an example of a touch node of FIG. 5 according to an embodiment of the present disclosure.

FIG. 6 is an enlarged plan view specifically illustrating an example of a touch node of FIG. 5.

Referring to FIG. 6, a touch node TN may be defined as an intersection of the driving electrode TE and the sensing electrode RE.

Since the driving electrodes TE and the sensing electrodes RE are disposed on the same layer, they may be disposed to be apart from each other. That is, a gap may be formed between the driving electrodes TE and the sensing electrodes RE adjacent to each other.

In addition, the dummy patterns DE may also be disposed on the same layer as the driving electrodes TE and the sensing electrodes RE. That is to say, there may be a gap between adjacent ones of the driving electrodes TE and the dummy patterns DE and between adjacent ones of the sensing electrodes RE and the dummy patterns DE.

Connection electrodes BE1 may be disposed on a different layer from the driving electrodes TE and the sensing electrodes RE. Connection electrodes BE1 may be formed to be bent at least once.

Although the connection electrodes BE1 have the shape of angle brackets "<" or ">" in the example shown in FIG. 6, the shape of the connection electrodes BE1 when viewed from the top is not limited thereto. Since the driving electrodes TE adjacent to each other in the second direction (y-axis direction) are connected by the plurality of connection electrodes BE1, even if any of the connection electrodes BE1 is disconnected, the driving electrodes TE can still be stably connected with each other. Although two adjacent ones of the driving electrodes TE are connected by two connection electrodes BE1 in the example shown in FIG. 5, the number of connection electrodes BE1 is not limited to two.

The connection electrodes BE1 may overlap the driving electrodes TE adjacent to one another in the second direction (y-axis direction) in the third direction (z-axis direction), which is the thickness direction of the substrate SUB. The connection electrodes BE1 may overlap the sensing electrodes RE in the third direction (z-axis direction). One side of each of the connection electrodes BE1 may be connected to one of the driving electrodes TE adjacent to each other in the second direction (y-axis direction) through touch contact holes TCNT1. The other side of each of the connection electrodes BE1 may be connected to another one of the driving electrodes TE adjacent to each other in the second direction (y-axis direction) through touch contact holes TCNT1.

The driving electrodes TE and the sensing electrodes RE may be electrically separated from each other at their intersections by virtue of the connection electrodes BE1. Accordingly, mutual capacitance can be formed between the driving electrodes TE and the sensing electrodes RE.

Each of the driving electrodes TE, the sensing electrodes RE and the connection electrodes BE1 may have a mesh structure or a net structure when viewed from the top. In addition, each of the dummy patterns DE may have a shape of a mesh structure or a net structure when viewed from the top. Accordingly, the driving electrodes TE, the sensing electrodes RE, the connection electrodes BE1 and the dummy patterns DE may not overlap emission areas EA1, EA2, EA3 and EA4 of each of the pixels PX. Therefore, it is possible to prevent the luminance of the lights emitted from the emission areas EA1, EA2, EA3 and EA4 from being lowered, which may occur as the lights are covered by the driving electrodes TE, the sensing electrodes RE, the connection electrodes BE1 and the dummy patterns DE.

Each of the pixels PX includes the first emission area EA1 that emits light of a first color, the second emission area EA2 that emits light of a second color, the third emission area EA3 that emits light of a third color, and the fourth emission area EA4 that emits light of the second color. For example, the first color may be red, the second color may be green, and the third color may be blue. Alternatively, the first and third emission areas EA1 and EA3 may emit green light which is light of the second color, the second emission area EA2 may emit red light which is light of the first color, and the fourth emission area EA4 may emit blue light which is light of the third color.

In each of the pixels PX, the first emission area EA1 and second emission area EA2 may be adjacent to each other in a fourth direction DR4 which is a diagonal direction, and the third emission area EA3 and the fourth emission area EA4 may be adjacent to each other in the fourth direction DR4. In each of the pixels PX, the first emission area EA1 and fourth emission area EA4 may be adjacent to each other in a fifth direction DR5 which is another diagonal direction crossing the fourth direction DR4, and the second emission area EA2 and the third emission area EA3 may be adjacent to each other in the fifth direction DR5.

Each of the first emission area EA1, the second emission area EA2, the third emission area EA3 and the fourth emission area EA4 may have, but is not limited to, a diamond or a rectangular shape when viewed from the top. Each of the first emission area EA1, the second emission area EA2, the third emission area EA3 and the fourth emission area EA4 may have a polygonal shape other than a quadrangular shape, a circular shape, or an elliptical shape when viewed from the top. In addition, although the third emission area EA3 is the largest while the second emission area EA2 and the fourth emission area EA4 are the smallest in the example shown in FIG. 7, the present disclosure is not limited thereto.

The second emission areas EA2 and the fourth emission areas EA4 may be arranged in odd rows. The second emission areas EA2 and the fourth emission areas EA4 may be arranged side by side in each of the odd rows in the first direction (x-axis direction). The second emission areas EA2 and the fourth emission areas EA4 may be arranged alternately in odd rows. Each of the second emission areas EA2 may have shorter sides in the fourth direction DR4 and longer sides in the fifth direction DR5, while each of the fourth emission areas EA4 may have longer sides in the fourth direction DR4 and shorter sides in the fifth direction DR5. The fourth direction DR4 may refer to the direction between the first direction (x-axis direction) and the second direction (y-axis direction), and may be inclined from the first direction (x-axis direction) by forty-five degrees. The fifth direction DR5 may be a direction perpendicular to the fourth direction DR4.

The first emission areas EA1 and the third emission areas EA3 may be arranged in even rows. The first emission areas EA1 and the third emission areas EA3 may be arranged side by side in each of the even rows in the first direction (x-axis direction). The first emission areas EA1 and the third emission areas EA3 may be alternately arranged in each of the even rows.

The second emission areas EA2 and the fourth emission areas EA4 may be arranged in odd columns. The second emission areas EA2 and the fourth emission areas EA4 may be arranged side by side in each of the odd columns in the second direction (y-axis direction). The second emission areas EA2 and the fourth emission areas EA4 may be arranged alternately in each of the odd columns.

The first emission areas EA1 and the third emission areas EA3 may be arranged in even columns. The first emission areas EA1 and the third emission areas EA3 may be arranged side by side in each of the even columns in the second direction (y-axis direction). The first emission areas EA1 and the third emission areas EA3 may be alternately arranged in each of the even columns.

Figure 7:
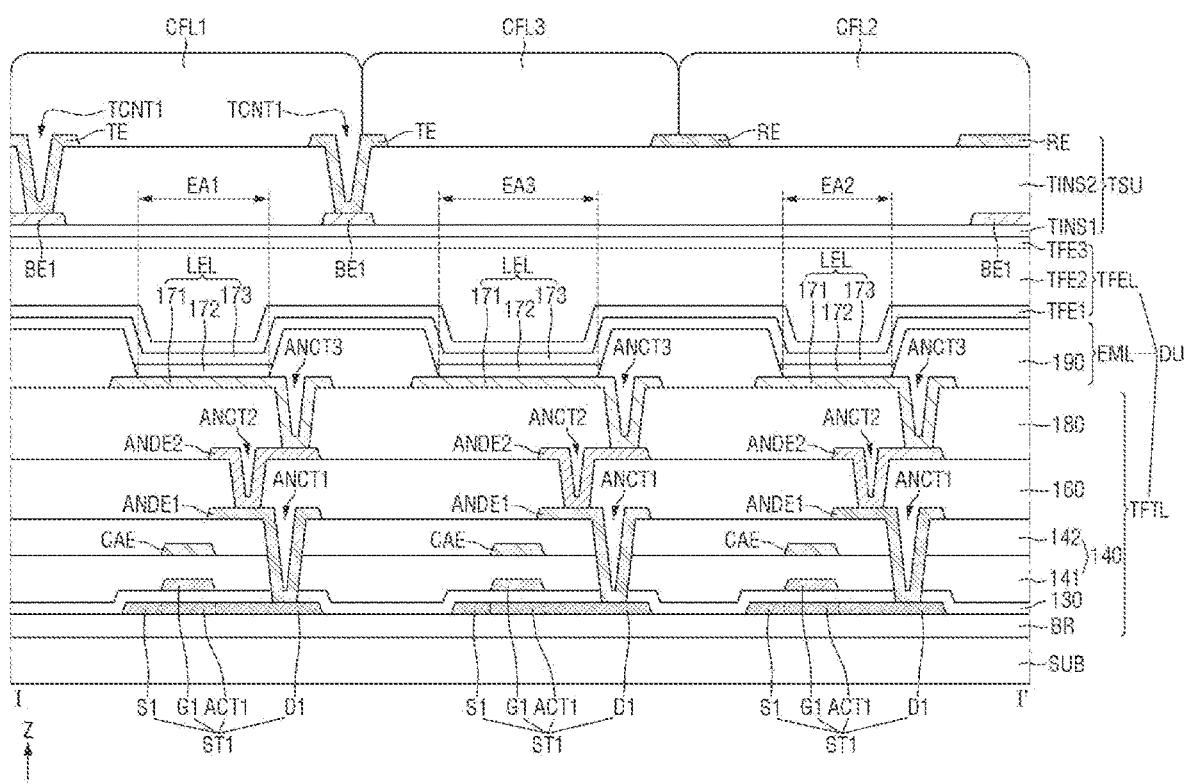
FIG. 7 is a cross-sectional view of an example of a display panel taken along line I-I' of FIG. 5 according to an embodiment of the present disclosure.

FIG. 7 is a cross-sectional view showing an example of a display panel taken along line I-I' of FIG. 5.

Referring to FIG. 7, a barrier layer BR may be disposed on the substrate SUB. The substrate SUB may be made of an insulating material such as a polymer resin. For example, the substrate SUB may be made of polyimide. The substrate SUB may be a flexible substrate that can be bent, folded, or rolled.

The barrier layer BR is a film for protecting the thin-film transistors of the thin-film transistor layer TFTL and a light-emitting layer 172 of the emission material layer EML. The barrier layer BR may be formed of multiple inorganic layers stacked on one another alternately. For example, the barrier layer BR may be made up of multiple layers in which one or more inorganic layers of a silicon nitride layer, a silicon oxynitride layer, a silicon oxide layer, a titanium oxide layer and an aluminum oxide layer are alternately stacked on one another.

Thin-film transistors ST1 may be disposed on the barrier layer BR. Each of the thin-film transistors ST1 includes an active layer ACT1, a gate electrode G1, a source electrode S1, and a drain electrode D1.

The active layer ACT1, the source electrode S1 and the drain electrode D1 of each of the thin-film transistors ST1 may be disposed on the barrier layer BR. The active layer ACT1 of each of the thin-film transistors ST1 includes or is formed of polycrystalline silicon, single crystalline silicon, low-temperature polycrystalline silicon, amorphous silicon, or an oxide semiconductor. A part of the active layer ACT1 overlapping the gate electrode G1 in the third direction (z-axis direction) that is the thickness direction of the substrate SUB may be defined as a channel region. The source electrode S1 and the drain electrode D1 are regions that do not overlap the gate electrode G1 in the third direction (z-axis direction), and may have conductivity by doping ions or impurities into a silicon semiconductor or an oxide semiconductor.

A gate insulator 130 may be disposed on the active layer ACT1, the source electrode S1 and the drain electrode D1 of each of the thin-film transistors ST1. The gate insulator 130 may be formed of an inorganic layer, for example, a silicon nitride layer, a silicon oxynitride layer, a silicon oxide layer, a titanium oxide layer, or an aluminum oxide layer.

The gate electrode G1 of each of the thin-film transistors ST1 may be disposed on the gate insulator 130. The gate electrode G1 may overlap the active layer ACT1 in the third direction (z-axis direction). The gate electrode G1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first interlayer dielectric layer 141 may be disposed on the gate electrode G1 of each of the thin-film transistors ST1. The first interlayer dielectric layer 141 may be formed of an inorganic layer, for example, a silicon nitride layer, a silicon oxynitride layer, a silicon oxide layer, a titanium oxide layer, or an aluminum oxide layer. The first interlayer dielectric layer 141 may be made of a plurality of inorganic layers.

A capacitor electrode CAE may be disposed on the first interlayer dielectric layer 141. The capacitor electrode CAE may overlap the gate electrode G1 of the first thin-film transistor ST1 in the third direction (z-axis direction). Since the first interlayer dielectric layer 141 has a predetermined dielectric constant, a capacitor can be formed by the capacitor electrode CAE, the gate electrode G1, and the first interlayer dielectric layer 141 disposed therebetween. The capacitor electrode CAE may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second interlayer dielectric layer 142 may be disposed over the capacitor electrode CAE. The second interlayer dielectric layer 142 may be formed of an inorganic layer, for example, a silicon nitride layer, a silicon oxynitride layer, a silicon oxide layer, a titanium oxide layer, or an aluminum oxide layer. The second interlayer dielectric layer 142 may be made of a plurality of inorganic layers.

A first anode connection electrode ANDE1 may be disposed on the second interlayer dielectric layer 142. The first anode connection electrode ANDE1 may be connected to the drain electrode D1 of the thin-film transistor ST1 through a first connection contact hole ANCT1 that penetrates the gate insulator 130, the first interlayer dielectric layer 141 and the second interlayer dielectric layer 142. The first anode connection electrode ANDE1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A first planarization layer 160 may be disposed over the first anode connection electrode ANDE1 for providing a flat surface over level differences due to the thin-film transistor ST1. The first planarization layer 160 may be formed of an organic layer such as an acryl resin, an epoxy resin, a phenolic resin, a polyamide resin and a polyimide resin.

A second anode connection electrode ANDE2 may be disposed on the first planarization layer 160. The second anode connection electrode ANDE2 may be connected to the first anode connection electrode ANDE1 through a second connection contact hole ANCT2 penetrating the first planarization layer 160. The second anode connection electrode ANDE2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

A second planarization layer 180 may be disposed on the second anode connection electrode ANDE2. The second planarization layer 180 may be formed as an organic layer such as an acryl resin, an epoxy resin, a phenolic resin, a polyamide resin and a polyimide resin.

Light-emitting elements LEL and a bank 190 may be disposed on the second planarization layer 180. Each of the light-emitting elements LEL includes a pixel electrode 171, the light-emitting layer 172, and a common electrode 173.

The pixel electrode 171 may be disposed on the second planarization layer 180. The pixel electrode 171 may be connected to the second anode connection electrode ANDE2 through a third connection contact hole ANCT3 penetrating the second planarization layer 180.

In the top-emission structure in which light exits from the light-emitting layer 172 toward the common electrode 173, the pixel electrode 171 may be made of a metal material having a high reflectivity. For example, the pixel electrode 171 may include a stack structure of aluminum and titanium (Ti/Al/Ti), a stack structure of aluminum and indium tin oxide (ITO) (ITO/Al/ITO), an APC alloy, or a stack structure of APC alloy and ITO (ITO/APC/ITO). The APC alloy is an alloy of silver (Ag), palladium (Pd) and copper (Cu).

In order to define the first emission area EA1, the second emission area EA2, the third emission area EA3 and the fourth emission area EA4, the bank 190 may be formed to partition the pixel electrode 171 on the second planarization layer 180. The bank 190 may be disposed to cover the edge of the pixel electrode 171. The bank 190 may be formed of an organic layer such as an acryl resin, an epoxy resin, a phenolic resin, a polyamide resin, and a polyimide resin.

In each of the first emission area EA1, the second emission area EA2, the third emission area EA3 and the fourth emission area EA4, the pixel electrode 171, the light-emitting layer 172 and the common electrode 173 are stacked on one another sequentially, so that holes from the pixel electrode 171 and electrons from the common electrode 173 are combined with each other in the light-emitting layer 172 to emit light.

The light-emitting layer 172 may be disposed on the pixel electrode 171 and the bank 190. The light-emitting layer 172 may include or may be formed of an organic material to emit light of a certain color. For example, the light-emitting layer 172 may include a hole transporting layer, an organic material layer, and an electron transporting layer.

The common electrode 173 may be disposed on the light-emitting layer 172. The common electrode 173 may be disposed to cover the light-emitting layer 172. The common electrode 173 may be a common layer formed commonly in the first emission area EA1, the second emission area EA2, the third emission area EA3 and the fourth emission area EA4. A capping layer may be formed on the common electrode 173.

In the top-emission organic light-emitting diode, the common electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the common electrode 173 is formed of a semi-transmissive metal material, the light extraction efficiency can be increased by using microcavities.

An encapsulation layer TFEL may be disposed on the common electrode 173. The encapsulation layer TFEL includes at least one inorganic layer to prevent permeation of oxygen or moisture into the emission material layer EML. In addition, the encapsulation layer TFEL includes or is formed of at least one organic layer to protect the emission material layer EML from foreign substances such as dust. For example, the encapsulation layer TFEL includes or is formed of a first inorganic encapsulation layer TFE1, an organic encapsulation layer TFE2 and a second inorganic encapsulation layer TFE3.

The first inorganic encapsulation layer TFE1 may be disposed on the common electrode 173, the organic encapsulation layer TFE2 may be disposed on the first inorganic encapsulation layer TFE1, and the second inorganic encapsulation layer TFE3 may be disposed on the organic encapsulation layer TFE2. The first inorganic encapsulation layer TFE1 and the second inorganic encapsulation layer TFE3 may be made up of multiple layers in which one or more inorganic layers of a silicon nitride layer, a silicon oxynitride layer, a silicon oxide layer, a titanium oxide layer and an aluminum oxide layer are alternately stacked on one another. The organic encapsulation layer TFE2 may be an organic layer such as an acryl resin, an epoxy resin, a phenolic resin, a polyamide resin, and a polyimide resin.

The touch detecting unit TSU may be disposed on the encapsulation layer TFEL. The touch detecting unit TSU includes a first touch insulating layer TINS1, connection electrodes BE1, a second touch insulating layer TINS2, the driving electrodes TE, and the sensing electrodes RE.

The first touch insulating layer TINS1 is formed on the front surfaces of the touch sensing area TSA and the touch peripheral area TPA. The first touch insulating layer TINS1 may be formed of an inorganic layer, for example, a silicon nitride layer, a silicon oxynitride layer, a silicon oxide layer, a titanium oxide layer, or an aluminum oxide layer.

The connection electrodes BE1 may be formed and disposed on the first touch insulating layer TINS1 of the touch sensing area TSA. The connection electrodes BE1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

When the connection electrodes BE1 is formed, each of the touch sensing lines RL may be formed and disposed in the touch peripheral area TPA through the same patterning process as that of the same metal material as that of the connection electrodes BE1. Each of the touch sensing lines RL may be patterned in an arrangement shape having a preset interval and a preset length.

The second touch insulating layer TINS2 is formed on the front surface of the first touch insulating layer TINS1 to cover both the connection electrodes BE1 of the touch sensing area TSA and the touch sensing lines RL of the touch peripheral area TPA. Here, the second touch insulating layer TINS2 is an acrylic resin, an epoxy resin, a phenolic resin, a polyamide resin, a polyimide resin, or a methacrylic resin. At least one organic material of a resin, polyisoprene, vinyl-based resin, urethane-based resin, cellulose-based resin, siloxane-based resin, and perylene-based resin may be included. Also, the second touch insulating layer TINS2 may further include zirconia.

The second touch insulating layer TINS2 covering both the connection electrodes BE1 of the touch sensing area TSA and the touch sensing lines RL of the touch peripheral area TPA is formed of an organic insulating layer, that is, an organic material layer, so that the second touch insulating layer TINS2 may be formed to be thicker or higher than the case in which the second touch insulating layer TINS2 is formed of an inorganic insulating layer. Accordingly, the interval in the thickness direction or the height direction (Z-axis direction) between the connection electrodes BE1 formed on the first touch insulating film TINS1 and the driving electrodes TE formed on the second touch insulating film TINS2 may be formed to be higher than the case in which the second touch insulating film TINS2 is formed of an inorganic insulating film. Accordingly, it is possible to reduce resistance and interference between lines adjacent to each other in the vertical direction or the front and rear directions with the organic insulating layer interposed therebetween, and increase signal transmission efficiency. For example, resistance and interference between the connection electrodes BE1 and the driving electrode TE may be reduced, and touch driving signal transmission efficiency may be increased. Similarly, resistance and interference between the connection electrodes BE1 and the sensing electrodes RE on the second touch insulating film TINS2 may also be reduced.

The driving electrodes TE, the sensing electrodes RE, and the dummy patterns DE, which are patterned on the second touch insulating film TINS2 of the touch sensing area TSA, may be any one of molybdenum (Mo), aluminum (Al), chromium (Cr), gold (Au), titanium (Ti), nickel (Ni), neodymium (Nd), copper (Cu), and alloys of the same.

When the driving electrodes TE, the sensing electrodes RE, and the dummy patterns DE are formed, the first and second touch driving lines TL1 and TL2 may be formed and disposed in the touch peripheral area TPA through the same metal material and the same patterning process as the driving electrodes TE, the sensing electrodes RE, and the dummy patterns DE. That is, the first and second touch driving lines TL1 and TL2 may be formed and disposed on the second touch insulating layer TINS2 of the touch peripheral area TPA. Each of the first and second touch driving lines TL1 and TL2 may be patterned in an arrangement shape having a preset interval and a preset length. The driving electrodes TE formed through the same patterning process may be formed to be electrically connected to the first and second touch driving lines TL1 and TL2.

As described above, since the second touch insulating layer TINS2 is formed as an organic insulating layer to be higher than the inorganic insulating layer, resistance between the touch sensing lines RL formed on the first touch insulating layer TINS1 of the touch peripheral area TPA and the first touch driving lines TL1 of the second touch insulating layer TINS2 may reduce, thereby increasing the transmission efficiency of touch driving signal or touch sensing signal. Similarly, resistance may also be reduced due to an increase in height between the touch sensing lines RL and the second touch driving lines TL2 of the touch peripheral area TPA.

The driving electrodes TE and the sensing electrodes RE may overlap the connection electrodes BE1 in the third direction (z-axis direction). The driving electrodes TE may be connected to the connection electrodes BE1 through touch contact holes TCNT1 penetrating through the second touch insulating layer TINS2. The sensing electrodes RE may be electrically connected to the respective touch sensing lines RL through the touch contact holes TCNT1 penetrating the second touch insulating layer TINS2.

A color filter layer CFL may be formed on the touch sensing area TSA in which the driving electrodes TE, the sensing electrodes RE, and the dummy patterns DE are formed. The color filter layer CFL includes a plurality of first to third color filters CFL1, CFL2, and CFL3. The plurality of first to third color filters CFL1, CFL2, and CFL3 may be disposed to have a planar shape on the second touch insulating layer TINS2 including the driving electrodes TE, the sensing electrodes RE, and the dummy patterns DE. For example, the color filter layer CFL may be formed on a third touch insulating layer TINS3 to overlap the each of the first to fourth emission areas EA1 to EA4, but also may be formed on the second touch insulating layer TINS2 including the driving electrodes TE and the sensing electrodes RE to overlap each of the first to fourth emission areas EA1 to EA4.

The first color filter CFL1 may be disposed on the first emission area EA1 emitting light of the first color, the second color filter CFL2 may be disposed on the second emission area EA2 emitting light of the second color, and the third color filter CFL3 may be disposed on the third emission area EA3 emitting light of the third color. In addition, the second color filter CFL2 may be disposed on the fourth emission area EA4 that emits light of the second color.

The first to third color filters CFL1, CFL2, and CFL3 not only transmit the light from the first to fourth emission areas EA1 to EA4 but also decrease reflectivity of light incident from the outside. As the external light passes through the first to third color filters CFL1, CFL2, and CFL3, an amount of the light may be decreased up to about ⅓. Accordingly, the light passing through the first to third color filters CFL1, CFL2, and CFL3 may be partially extinguished.

As shown in FIG. 7, when the color filter layer CFL and the likes are formed on the touch sensing area TSA in which the driving electrodes TE, the sensing electrodes RE, and the dummy patterns DE are formed, without forming a separate protective layer and the likes, a manufacturing process for forming the protective layer or the like may be omitted. The manufacturing process of the touch sensing unit TSU may be simplified by omitting the protective layer manufacturing process. On the other hand, the touch lines SL formed in the touch peripheral area TPA, that is, the touch sensing lines RL and the first and second touch driving lines TL1 and TL2 may be exposed to the front.

Figure 8:
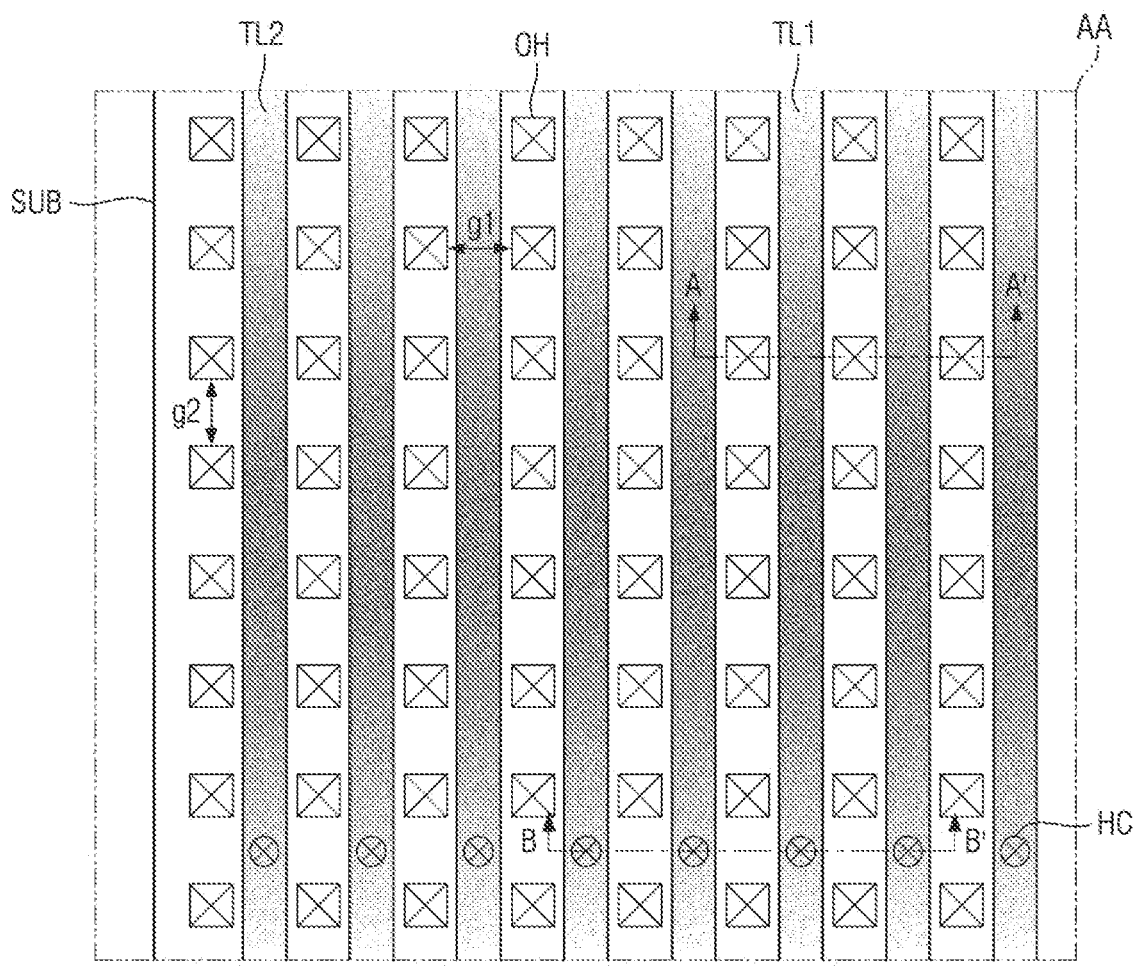
FIG. 8 is a schematic layout view of line AA area of FIG. 5 according to an embodiment of the present disclosure.

FIG. 8 is a schematic layout view of AA line area of FIG. 5.

Referring to FIG. 8 in conjunction with FIG. 5, the touch sensing unit TSU may be divided into the touch sensing area TSA for sensing a user's touch and the touch peripheral area TPA disposed around the touch sensing area TSA.

The driving electrodes TE and the sensing electrodes RE are disposed to cross the first and second directions (X-axis and Y-axis directions) in the touch sensing area TSA to detect a user's touch input.

The touch sensing lines R L connected to the sensing electrodes RE and the first and second touch driving lines TL1 and TL2 connected to the driving electrodes TE are disposed in the touch peripheral area TPA.

The touch sensing lines RL of the touch peripheral area TPA may be formed on the first touch insulating layer TINS1 or on the second touch insulating layer TINS2 to be electrically connected to the sensing electrodes RE. The touch sensing lines RL may be directly connected to the sensing electrodes RE or may be connected to the sensing electrodes RE through a contact hole or the like. Also, the touch sensing lines RL may be formed in a double layer on the first touch insulating layer TINS1 and the second touch insulating layer TINS2. In some embodiments, the touch sensing lines RL may be disposed on at least one of the first touch insulating layer TINS1 and the second touch insulating layer TINS2. Here, when the touch sensing lines RL are formed in parallel on the first and second touch insulating layers TINS1 and TINS2 in a vertical or front-and-rear direction as a double layer, transmission efficiency of touch sensing signals may be increased. One side of the touch sensing lines RL is connected to the sensing electrodes RE of the touch sensing area TSA, and the other side of the touch sensing lines RL partially passes through the touch peripheral area TPA to be connected to the pad unit PD formed in the subsidiary area SBA of the display panel 100.

The first and second touch driving lines TL1 and TL2 may be formed on the first touch insulating layer TINS1 or on the second touch insulating layer TINS2 to be electrically connected to the driving electrodes TE of the touch sensing area TSA.

The first and second touch driving lines TL1 and TL2 may be directly connected to the respective driving electrodes TE or may be connected to the driving electrodes TE through a contact hole or the like. Also, the first and second touch driving lines TL1 and TL2 may be formed in a double layer on the first touch insulating layer TINS1 and the second touch insulating layer TINS2. In an embodiment, the first and second touch driving lines TL1 and TL2 may be disposed on at least one of the first touch insulating layer TINS1 and the second touch insulating layer TINS2. Here, when the first and second touch driving lines TL1 and TL2 are formed in parallel on the first and second touch insulating layers TINS1 and TINS2 in a vertical or front-and-back direction as a double layer, the efficiency of transmission of touch driving signals may be increased. One side of the first and second touch driving lines TL1 and TL2 is connected to the driving electrodes TE of the touch sensing area TSA, and the other side of the first and second touch driving lines TL1 and TL2 partially passes through the touch peripheral area TPA so that one side of the second touch driving lines TL2 is connected to the pad unit PD formed in the subsidiary area SUB of the display panel 100.

The second touch insulating layer TINS2 covering at least any one of the lines formed on the first touch insulating layer TINS1 and the first touch insulating layer TINS1 is formed of an organic insulating layer including an organic material layer, and through holes OH passing through the second touch insulating layer TINS2 are formed in the second touch insulating layer TINS2.

The organic insulating layer may include an air layer or a water layer on the back or lower surface of the organic insulating layer due to the nature of the deposition process of the organic material layer. Accordingly, the through holes OH penetrating the second touch insulating layer TINS2 may be formed in the second touch insulating layer TINS2 of the subsidiary area SBA and the touch peripheral area TPA so that air and moisture can be discharged.

The through holes OH may be formed in peripheral regions that do not overlap the touch sensing lines RL or the first and second touch driving lines TL1 and TL2 of the second touch insulating layer TINS2 covering both the touch peripheral area TPA and the subsidiary area SBA adjacent to the pad unit PD.

The touch sensing lines RL disposed in the subsidiary area SBA may be alternately disposed with at least one of the first and second touch driving lines TL1 and TL2, and the through holes OH may be formed in a region between the first and second touch driving lines TL1 and TL2 and the touch sensing lines RL. In addition, the through holes OH may be formed in peripheral regions of the touch sensing lines RL and at least one of the first and second touch driving lines TL1 and TL2.

The through holes OH may be disposed at a first interval g1 with at least one of the first and second touch driving lines TL1 and TL2 interposed therebetween, and may be disposed at a second interval g2 between the first and second touch driving lines TL1 and TL2. Also, the first interval g1 and the second interval g2 of the through holes OH may be the same. In addition, the through holes OH may be disposed at the first interval g1 with at least one of the touch sensing lines RL interposed therebetween, and may be disposed at the second interval g2 between the first and second touch driving lines TL1 and TL2.

Although FIG. 8 illustrates an example in which the through holes OH are formed in the subsidiary area SBA adjacent to the pad unit PD through area AA, the through holes OH may also be formed in the touch peripheral area TPA except the subsidiary area SBA. As an example, the through holes OH may be disposed at the first interval g1 or the second interval g2 in the touch peripheral area TPA.

Figure 9:
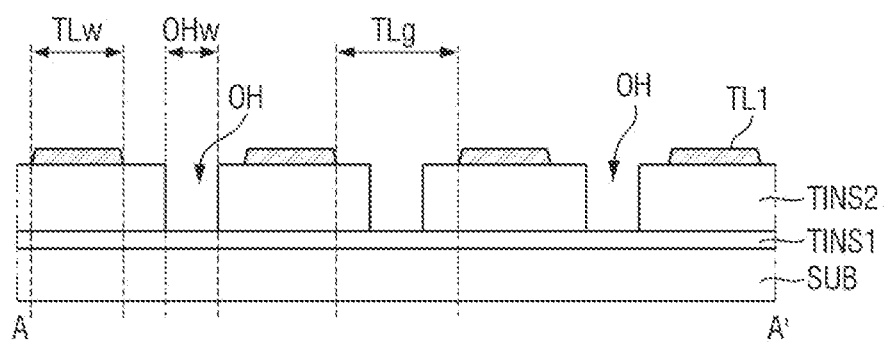
FIG. 9 is a cross-sectional view of an example of a line area cut along line A-A' of FIG. 8 according to an embodiment of the present disclosure.

FIG. 9 is a cross-sectional view of an example of a line area cut along line A-A' of FIG. 8.

Referring to FIG. 9, first and second touch driving lines TL1 and TL2 may be formed and disposed in the touch peripheral area TPA including the subsidiary area SBA. The first and second touch driving lines TL1 and TL2 may be formed on the second touch insulating layer TINS2 through the same patterning process as the touch driving electrode TE formed on the second touch insulating layer TINS2 of the touch sensing area TSA. The first and second touch driving lines TL1 and TL2 of the touch peripheral area TPA may be patterned and formed to have a preset interval and a preset length according to each previously designed design shape.

For example, the first and second touch driving lines TL1 and TL2 may be formed and disposed in the touch peripheral area TPA so that a preset first line distance TLg (i.e., a first driving line distance) is maintained, and the first line distance TLg between the first and second touch driving lines TL1 and TL2 may be formed to be wider than a width TLw of the first and second touch driving lines TL1 and TL2.

The through holes OH may be formed in a region between the first and second touch driving lines TL1 and TL2 and in the peripheral region of the first and second touch driving lines TL1 and TL2, respectively. A width OHw or an inner diameter of each of the through holes OH may be formed to be narrower than the first line distance TLg between the first and second touch driving lines TL1 and TL2. In this case, the width OHw or the inner diameter of each of the through holes OH may be the same as the width TLw of the first and second touch driving lines TL1 and TL2.

Figure 10:
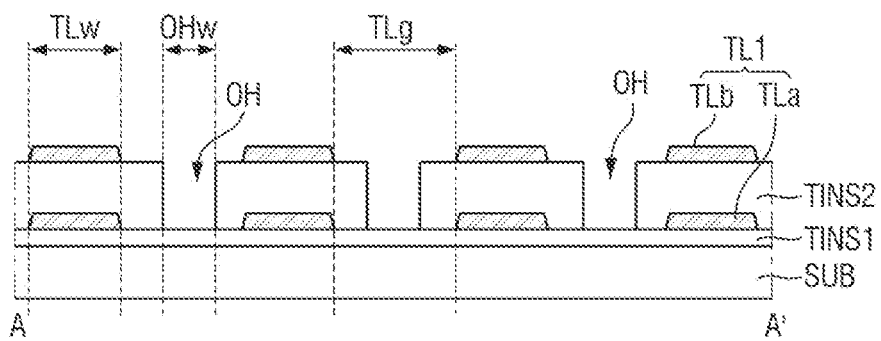
FIG. 10 is a cross-sectional view of another example of a line area cut along line A-A' of FIG. 8 according to an embodiment of the present disclosure.

FIG. 10 is a cross-sectional view of another example of a line area cut along line A-A' of FIG. 8.

Referring to FIG. 10, in the touch peripheral area TPA including the subsidiary area SBA, the first and second touch driving lines TL1 and TL2 may be formed and disposed as a double layer parallel to the vertical or front-and-rear directions. The first and second touch driving lines TL1 and TL2 may be formed as a lower driving line TLa formed on the first touch insulating layer TINS1 of the touch sensing area TSA and an upper driving line TLb formed on the second touch insulating layer TINS2.

The lower driving line TLa among the first and second touch driving lines TL1 and TL2 of the double layer may be simultaneously patterned with the touch sensing electrode RE formed on the first touch insulating layer TINS1 to be formed on the first touch insulating layer TINS1 of the touch peripheral area TPA. In addition, the upper driving line TLb among the first and second touch driving lines TL1 and TL2 of the double layer may be formed through the same patterning process as that of the touch driving electrode TE formed on the second touch insulating layer TINS2. The lower driving line TLa and the upper driving line TLb may be electrically connected through a separate contact hole ('HC' of FIG. 8).

The first and second touch driving lines TL1 and TL2 formed as a double layer in the touch peripheral area TPA may be patterned and formed to have a predetermined interval and a predetermined length according to each previously designed design shape.

For example, the first and second touch driving lines TL1 and TL2 may be formed and disposed in the touch peripheral area TPA so that the preset first line distance TLg is maintained, and the first line distance TLg between the first and second touch driving lines TL1 and TL2 may be formed to be wider than a width TLw of the first and second touch driving lines TL1 and TL2.

The through holes OH are formed in an area between the first and second touch driving lines TL1 and TL2 and in a peripheral area of the first and second touch driving lines TL1 and TL2 formed in a double layer, and the width OHw or the inner diameter of each of the through holes OH may be formed to be narrower than the first line distance TLg between the first and second touch driving lines TL1 and TL2. In this case, the width OHw or the inner diameter of each of the through holes OH may be the same as the width TLw of the first and second touch driving lines TL1 and TL2.

Figure 11:
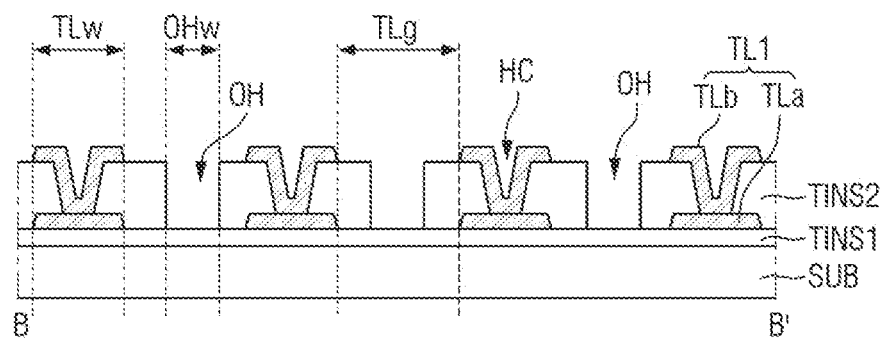
FIG. 11 is a cross-sectional view of an example of a line area cut along line B-B' of FIG. 8 according to an embodiment of the present disclosure.

FIG. 11 is a cross-sectional view of an example of a line area cut along line B-B' of FIG. 8.

As shown in FIG. 11, the lower driving line TLa among the first and second touch driving lines TL1 and TL2 of the double layer may be formed on the first touch insulating layer TINS1 of the touch peripheral area TPA. The upper driving line TLb among the first and second touch driving lines TL1 and TL2 of the double layer may be formed on the second touch insulating layer TINS2. The lower driving line TLa and the upper driving line TLb of each of the first and second touch driving lines TL1 and TL2 may be electrically connected through at least one contact hole HC.

Figure 12:
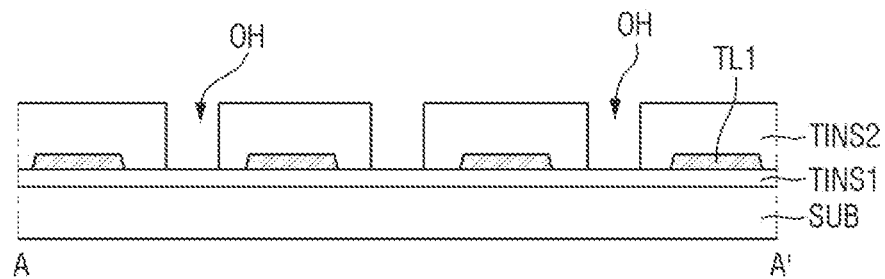
FIG. 12 is a cross-sectional view of another example of a line area cut along line A-A' of FIG. 8 according to an embodiment of the present disclosure.

FIG. 12 is a cross-sectional view of another example of a line area cut along line A-A' of FIG. 8.

Referring to FIG. 12, as another example, the first and second touch driving lines TL1 and TL2 may be patterned simultaneously with the touch sensing electrode RE formed on the first touch insulating layer TINS1 to be formed on the first touch insulating layer TINS1 of the touch peripheral area TPA. Further, the first and second touch driving lines TL1 and TL2 may be electrically connected to the touch driving electrode TE formed on the second touch insulating layer TINS2 through each contact hole.

For example, the first and second touch driving lines TL1 and TL2 formed on the first touch insulating layer TINS1 may be formed and disposed in the touch peripheral area TPA so that a preset first line distance TLg is maintained, and the first line distance TLg between the first and second touch driving lines TL1 and TL2 may be wider than the width TLw of the first and second touch driving lines TL1 and TL2.

The through holes OH may be formed in an area between the first and second touch driving lines TL1 and TL2 and in a peripheral area of the first and second touch driving lines TL1 and TL2, and the width OHw or the inner diameter of each of the through holes OH may be formed to be narrower than the first line distance TLg between the first and second touch driving lines TL1 and TL2. In this case, the width OHw or the inner diameter of each of the through holes OH may be the same as the width TLw of the first and second touch driving lines TL1 and TL2.

Figure 13:
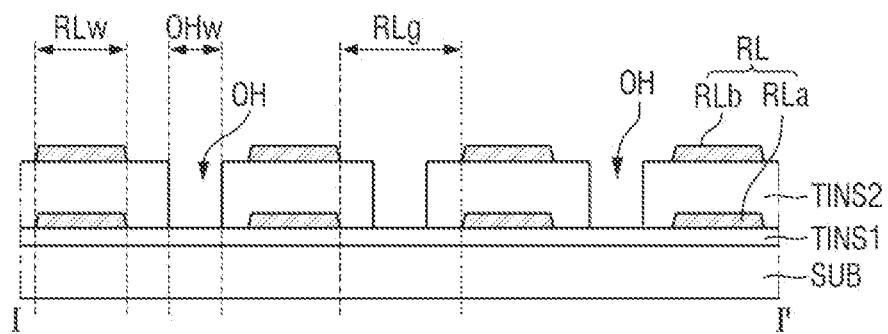
FIG. 13 is a cross-sectional view of an example of a line area cut along line I-I' of FIG. 5 according to an embodiment of the present disclosure.

FIG. 13 is a cross-sectional view of an example of a line area cut along line I-I' of FIG. 5.

Referring to FIG. 13, in the touch peripheral area TPA including the subsidiary area SBA, the touch sensing lines RL may be formed and disposed in a double layer parallel to each other in a vertical or front-back direction. The touch sensing lines RL may be formed including a lower sensing line RLa formed on the first touch insulating layer TINS1 and an upper sensing line RLb formed on the second touch insulating layer TINS2 of the touch sensing area TSA.

Among the double-layered touch sensing lines RL, the lower sensing line RLa may be patterned simultaneously with the touch sensing electrode RE formed on the first touch insulating layer TINS1, so that the lower sensing line RLa is formed on the first touch insulating layer TINS1. Among the double-layered touch sensing lines RL, the upper sensing line RLb may be formed on the second touch insulating layer TINS2 through the same patterning process as the touch driving electrode TE formed on the second touch insulating layer TINS2. The lower sensing line RLa and the upper sensing line RLb may be electrically connected through at least one contact hole HC, respectively.

The touch sensing lines RL formed in a double layer in the touch peripheral area TPA may be patterned and formed with a preset length with a preset interval according to each predesigned design shape.

For example, the touch sensing lines RL may be formed and disposed in the touch peripheral area TPA so that a preset first sensing line distance RLg is maintained, and the first sensing line distance RLg between the touch sensing lines RL may be formed to be wider than a width RLw of the touch sensing lines RL. In some embodiments, the preset first line distance TLg and the preset first sensing line distance RLg may be the same.

The through holes OH may be formed in the area between the touch sensing lines RL and the peripheral area of the touch sensing lines RL formed in a double layer, and the width OHw or the inner diameter of each of the through holes OH may be formed to be narrower than the first sensing line distance RLg between the touch sensing lines RL formed in a double layer. In this case, the width OHw or the inner diameter of each of the through holes OH may be the same as the width RLw of the touch sensing lines RL formed in a double layer.

Figure 14:
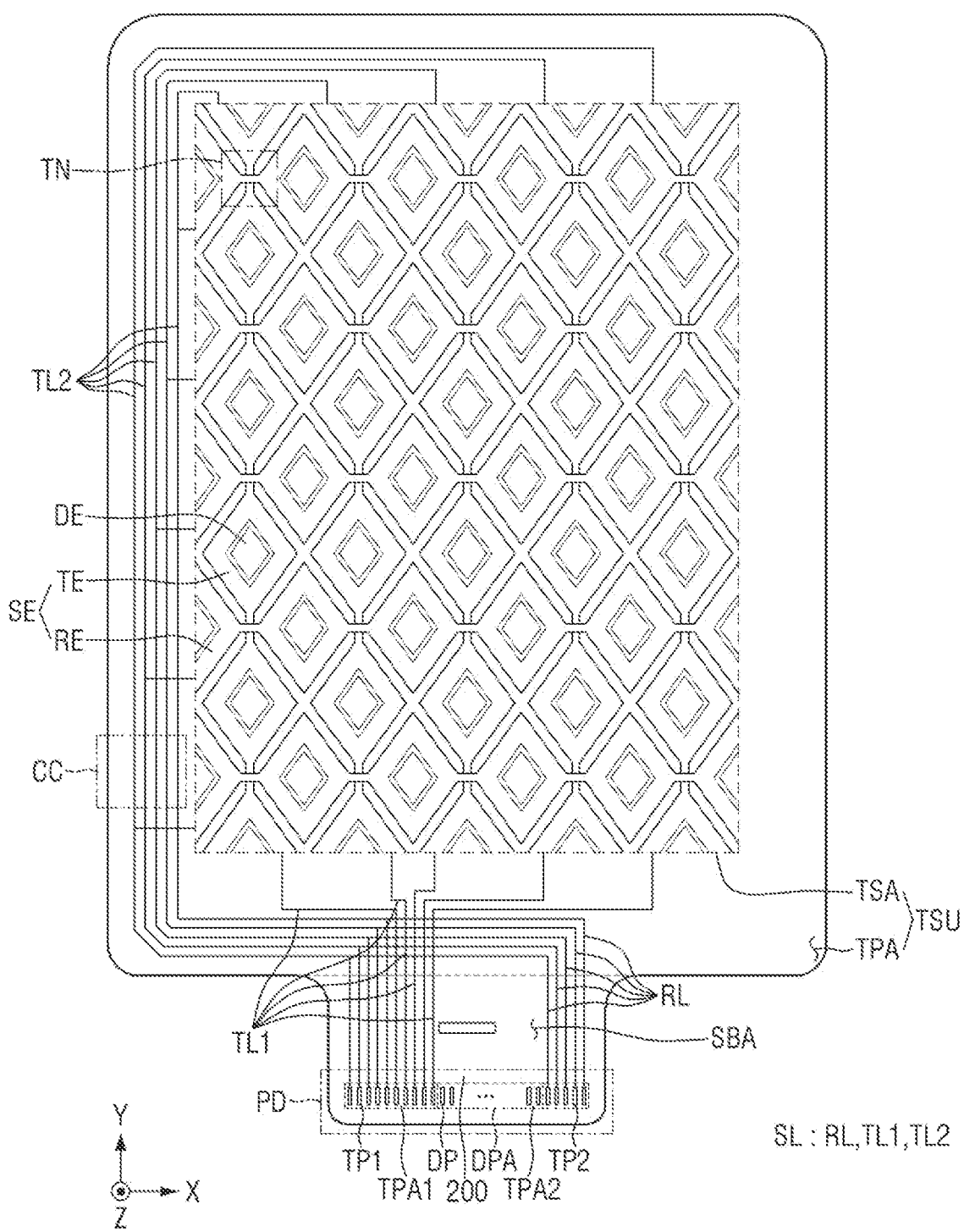
FIG. 14 is a schematic layout view of a touch detection module of FIG. 5 according to an embodiment of the present disclosure.

FIG. 14 is a schematic layout view of a touch detection module of FIG. 5 according to an embodiment.

Referring to FIG. 14, the touch sensing lines RL and the second touch driving lines TL2 may be formed in the same direction in the touch peripheral area TPA along the periphery of the touch sensing area TSA.

Specifically, the touch sensing lines RL may be formed and arranged in parallel to one direction of the touch peripheral area TPA along the lower surface and one side of the touch sensing area TSA. One side of the touch sensing lines RL is connected to the sensing electrodes RE of the touch sensing area TSA, and the other side of the touch sensing lines RL partially passes through the touch peripheral area TPA to be connected to the pad unit PD formed in subsidiary area SBA of the display panel 100.

In particular, the second touch driving lines TL2 may be alternately adjacent to the touch sensing lines RL arranged side by side and may be formed and disposed in one direction of the same touch peripheral area TPA as the touch sensing lines RL. When one side of the second touch driving lines TL2 is connected to the driving electrodes TE of the touch sensing area TSA, the other side of the second touch driving lines TL2 partially passes through the touch peripheral area TPA, so that one side of the second touch driving lines TL2 is connected to the pad unit PD formed in the subsidiary area SBA of the display panel 100.

Figure 15:
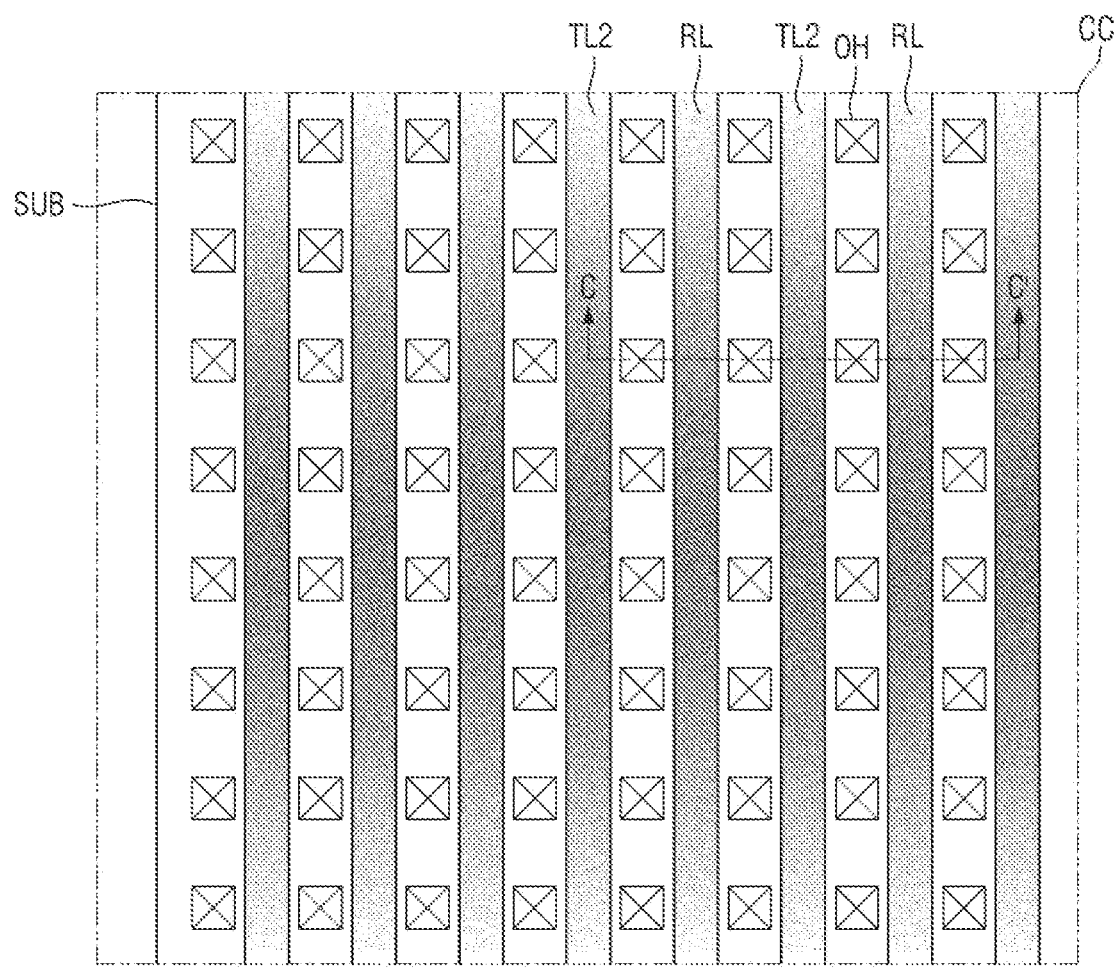
FIG. 15 is a schematic layout view illustrating a CC line area of FIG. 14 according to an embodiment of the present disclosure.

FIG. 15 is a schematic layout view illustrating a CC line area of FIG. 14. In addition, FIG. 16 is a cross-sectional view of an example of a line area cut along line C-C' of FIG. 15.

Figure 16:
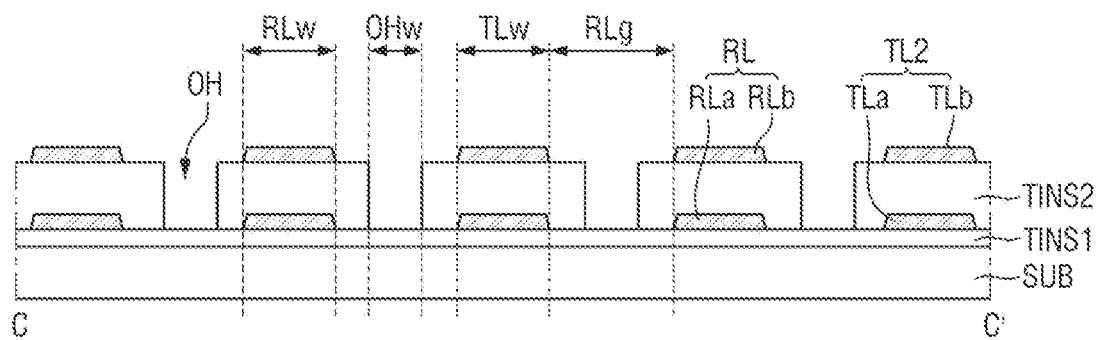
FIG. 16 is a cross-sectional view of an example of a line area cut along line C-C' of FIG. 14 according to an embodiment of the present disclosure.

Referring to FIGS. 15 and 16, the touch sensing lines RL and the second touch driving lines TL2 of the touch peripheral area TPA are alternately arranged adjacent to each other, and each of the touch sensing lines RL and the second touch driving lines TL2 are formed as a double layer on the first touch insulating layer TINS1 and the second touch insulating layer TINS2.

The through holes OH are formed in a space that does not overlap the first and second touch driving lines TL1 and TL2 or the touch sensing lines RL of the second touch insulating layer TINS2 which covers both the subsidiary area SBA and the touch peripheral area TPA.

For example, the through holes OH may be disposed at a first interval g1 with at least one touch driving line of the first and second touch driving lines TL1 and TL2 interposed therebetween, and may be disposed at a second interval g2 between the second touch driving lines TL2.

As another example, the through holes OH may be disposed at the first interval g1 with at least one touch sensing line RL among the touch sensing lines RL interposed therebetween, and may be disposed at the second interval g2 between the touch sensing lines RL and the first or second touch driving lines TL1 and TL2.

Referring to FIG. 16, touch sensing lines RL and first and second touch driving lines TL1 and TL2 are formed and disposed in the touch peripheral area TPA so that a preset second line distance RLg is maintained. A second line distance RLg between the touch sensing lines RL and the first and second touch driving lines TL1 and TL2 may be formed to be wider than the width RLw of the touch sensing lines RL.

The through holes OH may be formed in an area between the touch sensing lines RL and the first and second touch driving lines TL1 and TL2 and in a peripheral area of at least one line among the touch sensing lines RL and the first and second touch driving lines TL1 and TL2. The width OHw or the inner diameter of each of the through holes OH may be formed to be narrower than the second line distance RLg between the touch sensing lines RL and the first and second touch driving lines TL1 and TL2.

Figure 17:
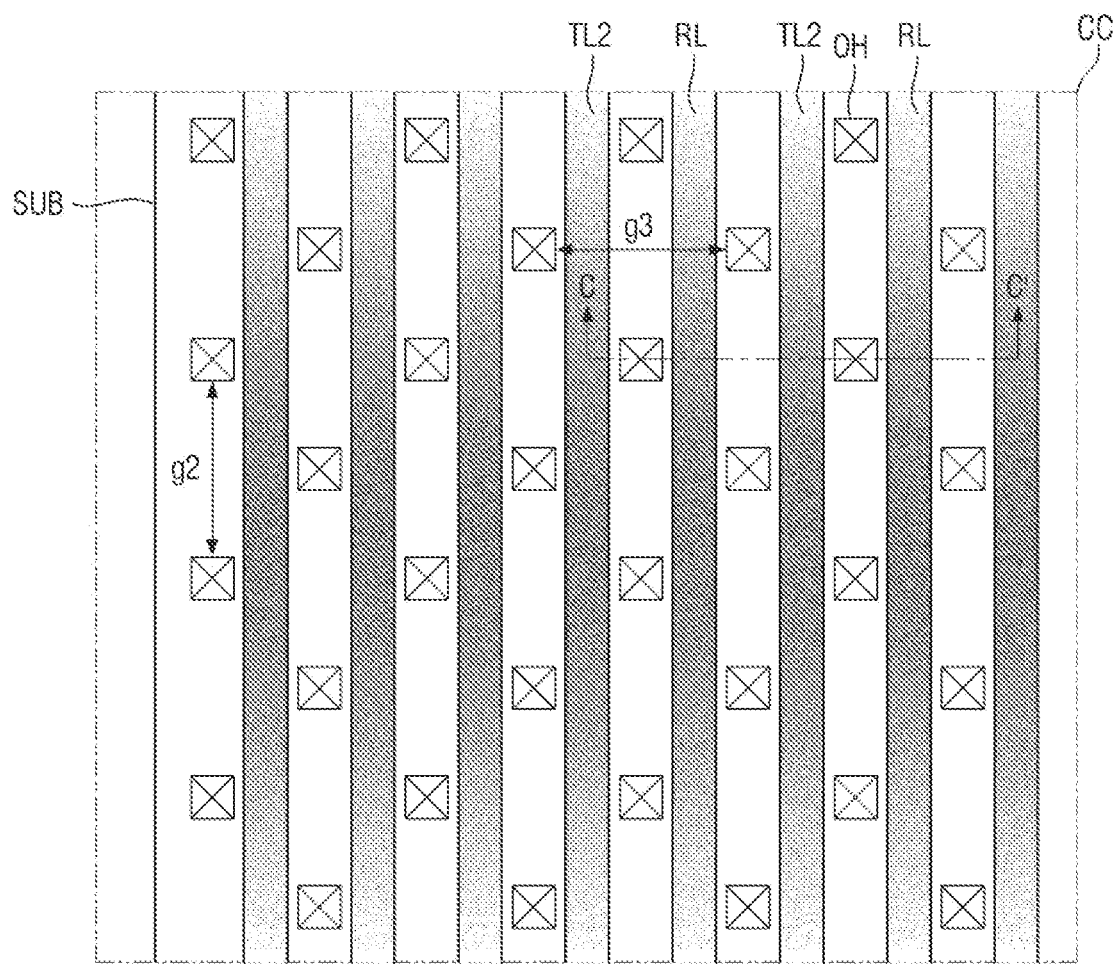
FIG. 17 is a schematic layout view of another example of CC line area of FIG. 14 according to an embodiment of the present disclosure.

FIG. 17 is a schematic layout view of another example of CC line area of FIG. 14.

Referring to FIG. 17, the through holes OH are formed in areas that do not overlap the touch sensing lines RL the first and second touch driving lines TL1 and TL2 among the second touch insulating film TINS2 which covers both the subsidiary area SBA and the touch peripheral area TPA.

The through holes OH may be disposed at the second interval g2 between the touch sensing lines RL and the first and second touch driving lines TL1 and TL2, and may be disposed at a third interval g3 with a plurality of lines among the touch sensing lines RL and the first and second touch driving lines TL1 and TL2 interposed therebetween. Here, the second interval g2 of the through holes OH disposed between the touch sensing lines RL and the first and second touch driving lines TL1 and TL2 may be formed as a narrower interval than the third interval g3 in which the plurality of lines among the touch sensing lines RL and the first and second touch driving lines TL1 and TL2 are interposed therebetween. Accordingly, the touch peripheral area TPA or the subsidiary area SBA may be more easily bent in the direction in which the third interval g3 of the through holes OH is formed.

Figure 18:
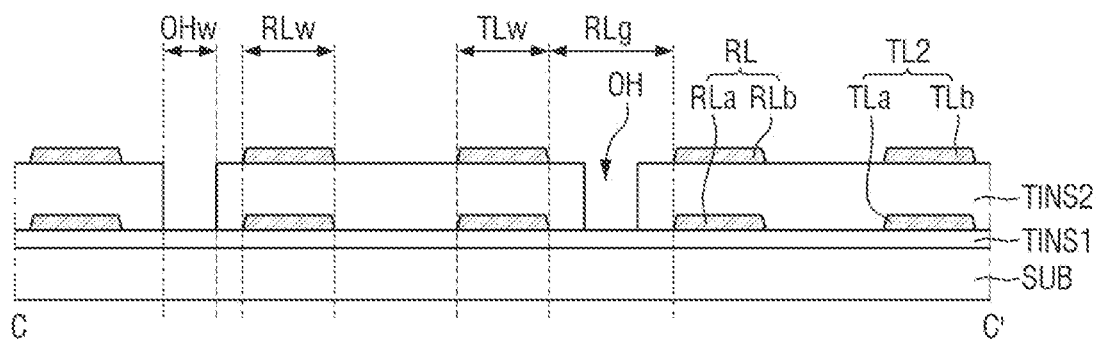
FIG. 18 is a cross-sectional view of an example of a line area cut along line C-C' of FIG. 17 according to an embodiment of the present disclosure.

FIG. 18 is a cross-sectional view of an example of a line area cut along line C-C' of FIG. 17.

Referring to FIG. 18, the touch sensing lines RL and the first and second touch driving lines TL1 and TL2, which are alternately arranged adjacent to each other, are formed and disposed in the touch peripheral area TPA so that the preset second line distance RLg is maintained.

The second line distance RLg between the touch sensing lines RL and the first and second touch driving lines TL1 and TL2 may be formed to be wider than the width RLw of the touch sensing lines RL.

The through holes OH may be formed in an area between the touch sensing lines RL and the first and second touch driving lines TL1 and TL2, and in a peripheral area of at least one line among the touch sensing lines RL and the first and second touch driving lines TL1 and TL2. The width OHw or the inner diameter of each of the through holes OH may be formed to be the same as the width RLw of the touch sensing lines RL, and be narrower than the second line distance RLg between the second touch driving lines TL2.

Figure 19:
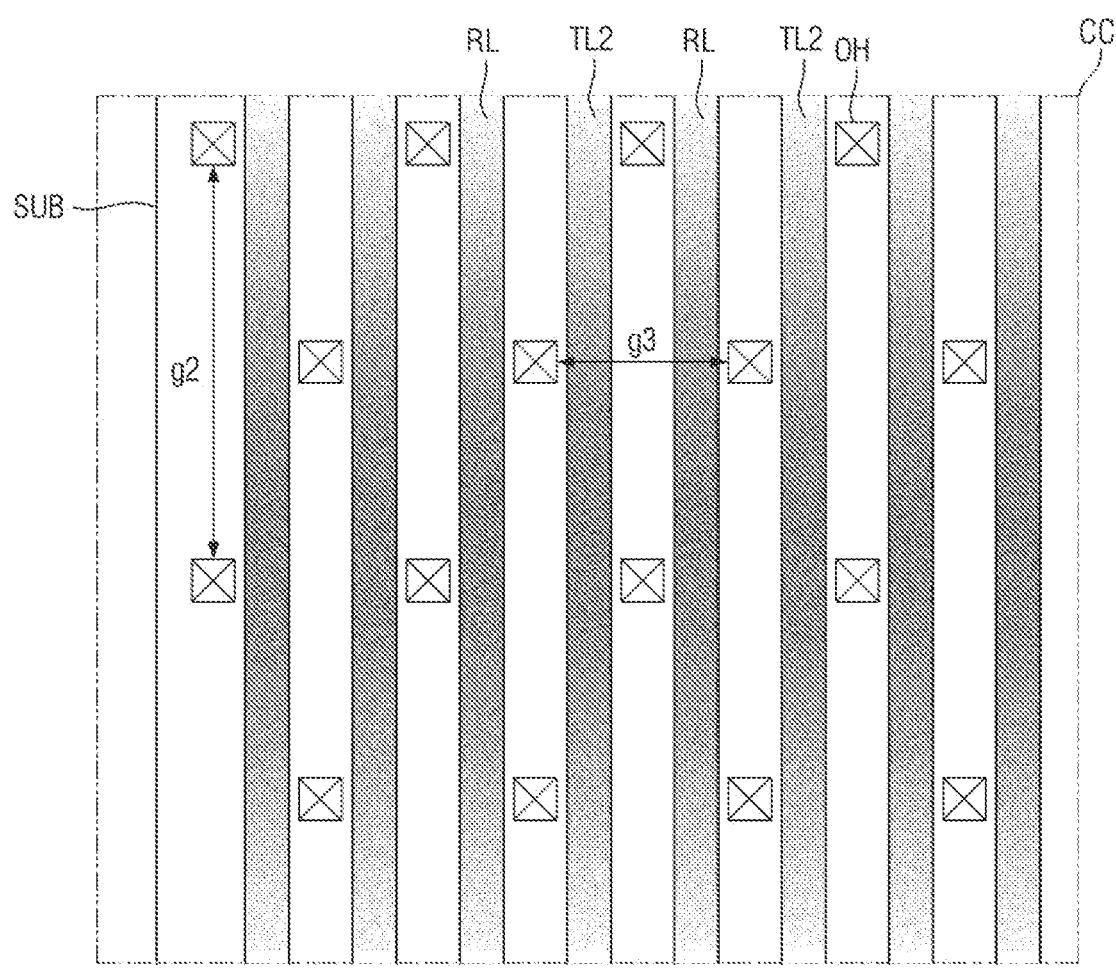
FIG. 19 is a schematic layout view illustrating another example of CC line area of FIG. 14 according to an embodiment of the present disclosure.

FIG. 19 is a schematic layout view illustrating another example of CC line area of FIG. 11.

Referring to FIG. 19, the through holes OH mat be formed in areas in which the first and second touch driving lines TL1 and TL2 or touch sensing lines RL do not overlap among the second touch insulating layer TINS2 which covers both the subsidiary area SBA and the touch peripheral area TPA.

The through holes OH may be disposed at the second interval g2 between the touch sensing lines RL and the first and second touch driving lines TL1 and TL2, and may be disposed at the third interval g3 with a plurality of lines among the touch sensing lines RL and the first and second touch driving lines TL1 and TL2 interposed therebetween. Here, the second interval g2 of the through holes OH disposed between the touch sensing lines RL and the first and second touch driving lines TL1 and TL2 may be formed as a wider interval than the third interval g3 in which the plurality of lines are interposed therebetween. Accordingly, the touch peripheral area TPA or the subsidiary area SBA may be more easily bent in the direction in which the second interval g2 of the through holes OH is formed.

Figure 20:
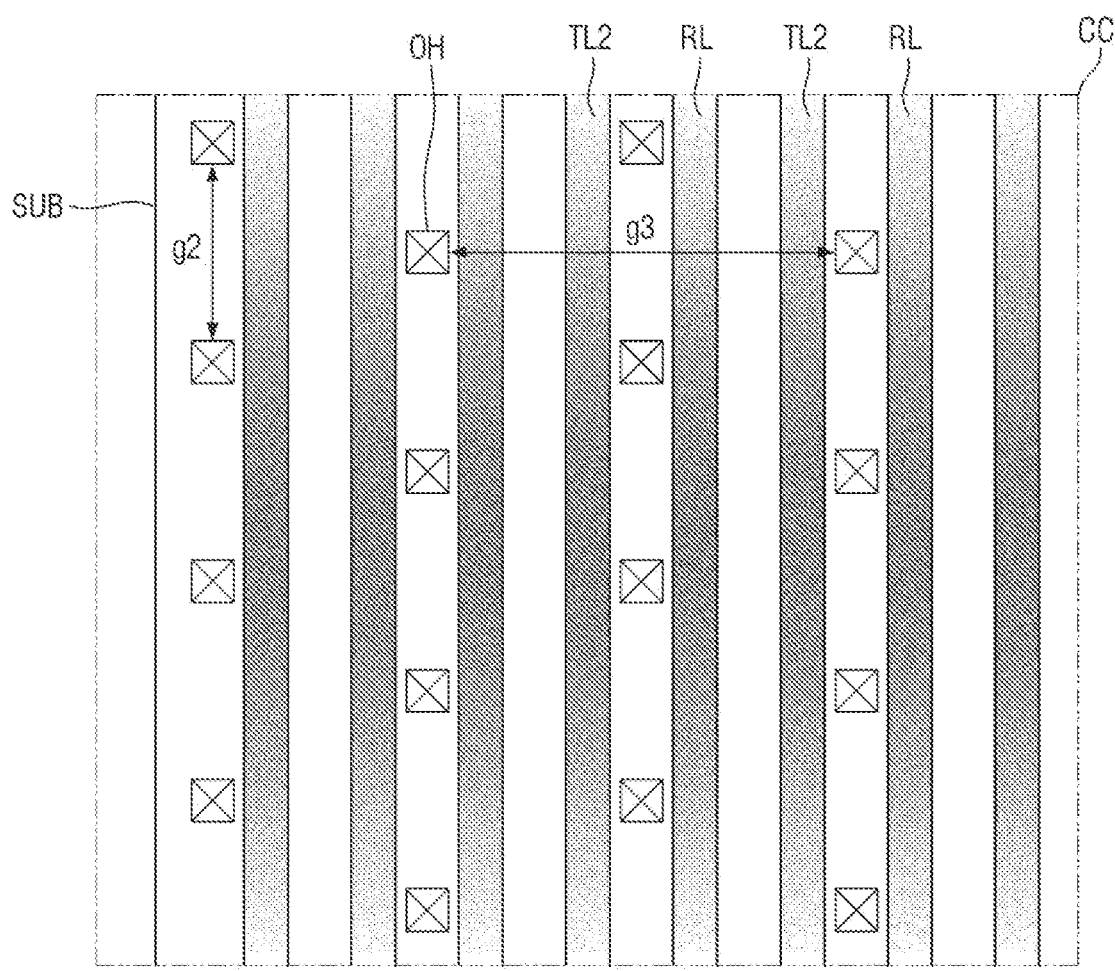
FIG. 20 is a schematic layout view illustrating a CC line area of FIG. 14 according to an embodiment of the present disclosure.

FIG. 20 is a schematic layout view illustrating a CC line area of FIG. 14 according to an embodiment.

Referring to FIG. 20, the through holes OH may be disposed at the second interval g2 between the touch sensing lines RL and the first and second touch driving lines TL1 and TL2, and may be disposed at the third interval g3 with a plurality of lines among the touch sensing lines RL and the first and second touch driving lines TL1 and TL2 interposed therebetween.

The third interval g3 of through holes OH in which the plurality of lines among the touch sensing lines RL and the first and second touch driving lines TL1 and TL2 are interposed between may be formed as intervals wider than the second interval g2 of the through holes OH disposed between the touch sensing lines RL and the first and second touch driving lines TL1. Accordingly, the touch peripheral area TPA or the subsidiary area SBA may be more easily bent in a direction in which the third interval g3 of the through holes OH is formed.

Figure 21:
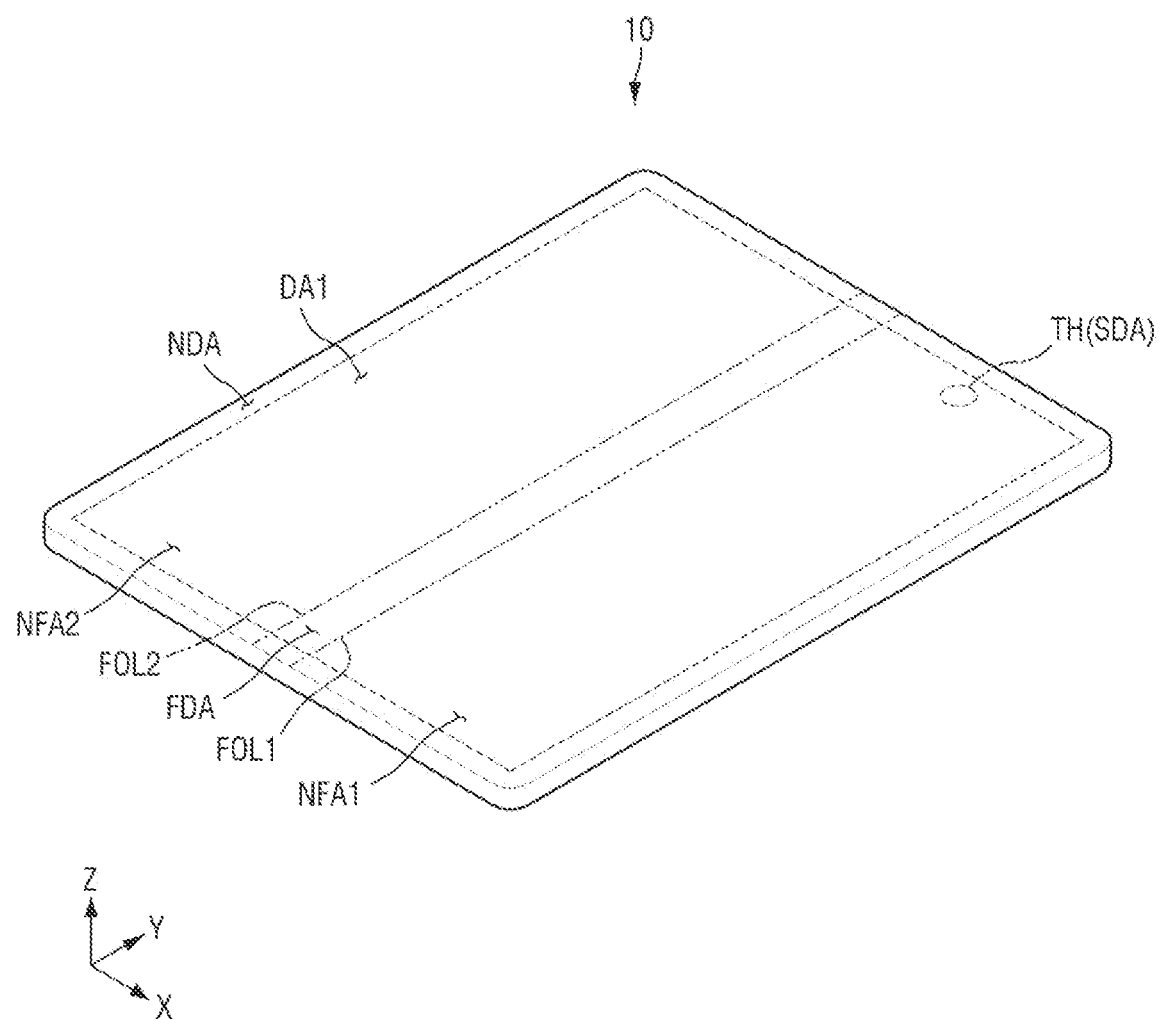
FIGS. 21 and 22 are perspective views illustrating a display device according to an embodiment of the present disclosure.
Figure 22:
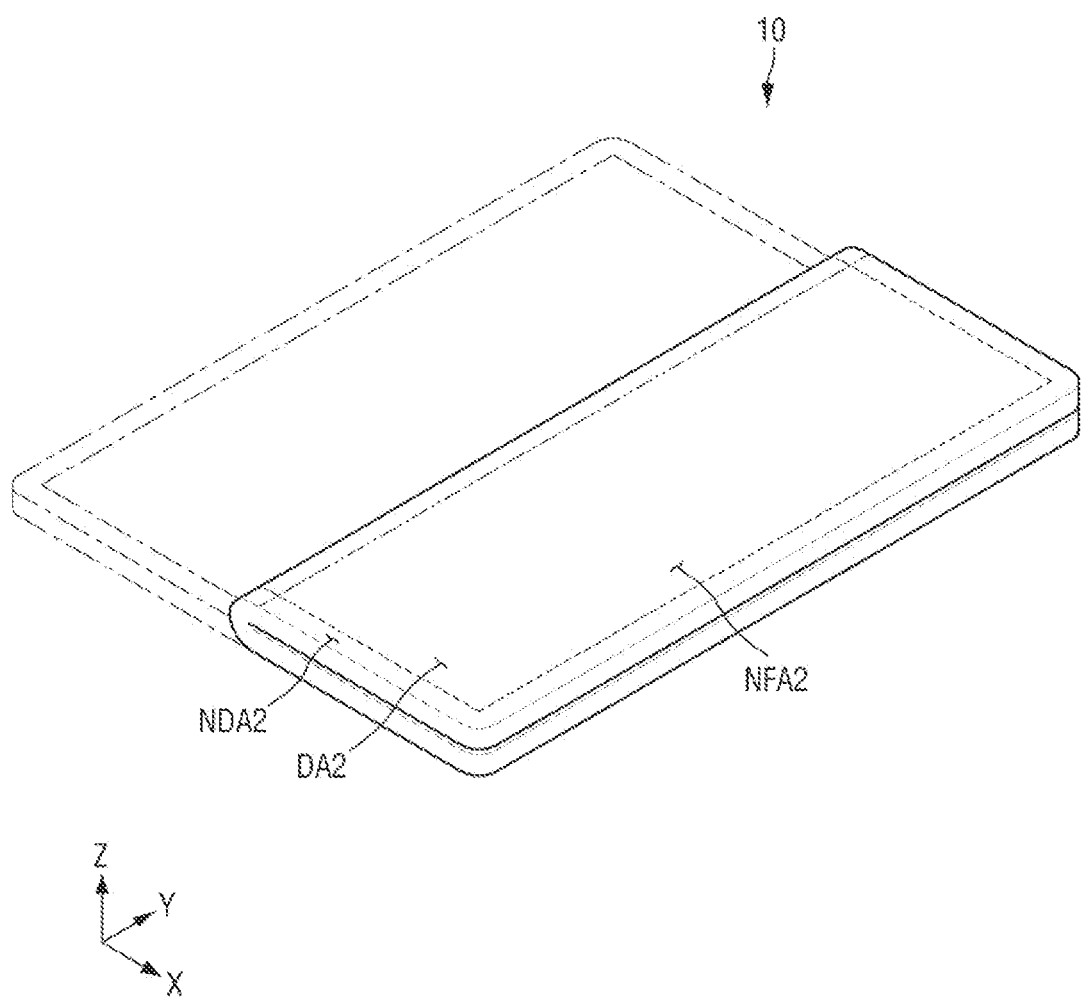

FIGS. 21 and 22 are perspective views illustrating a display device according to an embodiment of the present disclosure.

In FIGS. 21 and 22, the display device 10 is illustrated as a foldable display device that is folded in a first direction (X-axis direction). The display device 10 may maintain both a folded state and an unfolded state. The display device 10 may be folded in an in-folding manner in which its front surface is disposed inside. When the display device 10 is bent or folded in the in-folding manner, portions of the front surface of the display device 10 may face each other. Alternatively, the display device 10 may be folded in an out-folding manner in which its front surface is disposed outside. When the display device 10 is bent or folded in the out-folding manner, portions of a rear surface of the display device 10 may face each other.

A first non-folding area NFA1 may be disposed on a side, e.g., a right side of a folding area FDA. A second non-folding area NFA2 may be disposed on the other side, e.g., a left side of the folding area FDA. A touch detecting unit TSU according to an embodiment of the present specification may be formed and disposed in each of the first non-folding area NFA1 and the second non-folding area NFA2.

A first folding line FOL1 and a second folding line FOL2 may extend in a second direction (Y-axis direction), and the display device 10 may be folded in the first direction (X-axis direction). Therefore, since a length of the display device 10 in the first direction (X-axis direction) can be reduced to about half, a user can easily carry the display device 10.

The first folding line FOL1 and the second folding line FOL2 may not necessarily extend in the second direction (Y-axis direction). For example, the first folding line FOL1 and the second folding line FOL2 may extend in the first direction (X-axis direction), and the display device 10 may be folded in the second direction (Y-axis direction). In this case, a length of the display device 10 in the second direction (Y-axis direction) may be reduced to about half. Alternatively, the first folding line FOL1 and the second folding line FOL2 may extend in a diagonal direction of the display device 10 between the first direction (X-axis direction) and the second direction (Y-axis direction). In this case, the display device 10 may be folded in a triangular shape.

When the first folding line FOL1 and the second folding line FOL2 extend in the second direction (Y-axis direction), a length of the folding area FDA may be smaller in the first direction (X-axis direction) than in the second direction (Y-axis direction). In addition, a length of the first non-folding area NFA1 in the first direction (X-axis direction) may be greater than the length of the folding area FDA in the first direction (X-axis direction). A length of the second non-folding area NFA2 in the first direction (X-axis direction) may be greater than the length of the folding area FDA in the first direction (X-axis direction).

A first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in a forward direction on the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2. Therefore, when the display device 10 is folded, an image may be displayed in the forward direction on the second non-folding area NFA2 of the display device 10.

Although a through hole TH in which a camera SDA or the like is formed is disposed in the first non-folding area NFA1 in FIGS. 21 and 2, the present disclosure is not limited thereto. The through hole TH or the camera SDA may also be disposed in the second non-folding area NFA2 or the folding area FDA.

Figure 23:
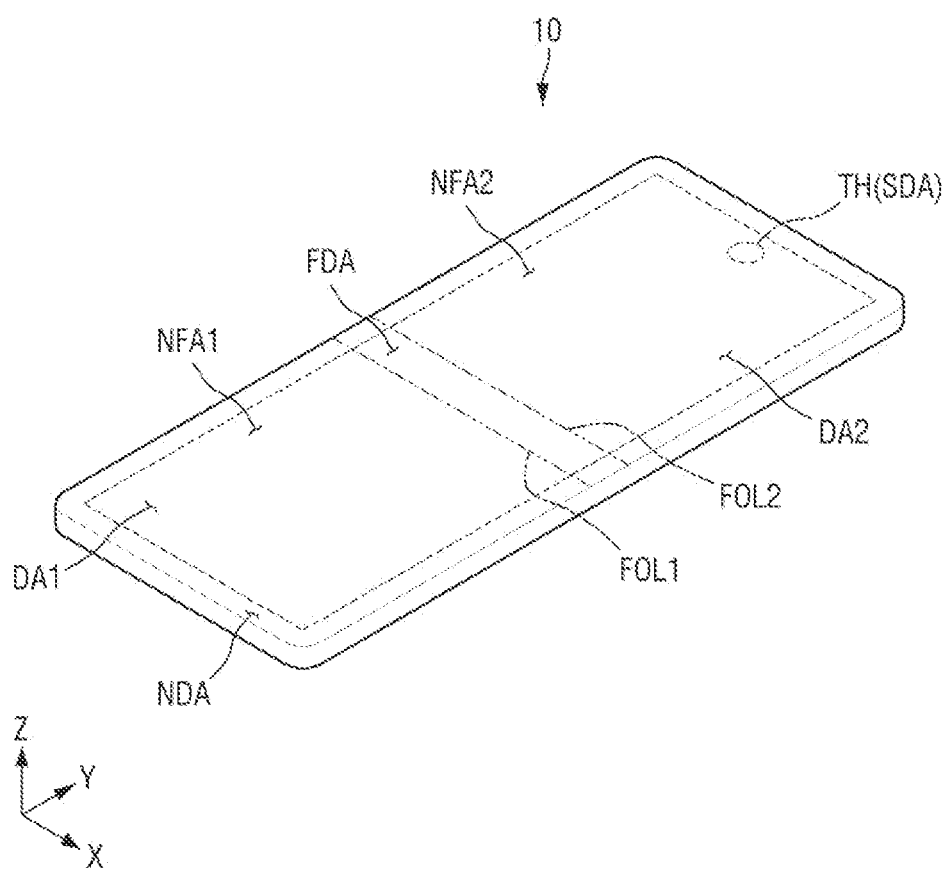
FIGS. 23 and 24 are perspective views illustrating a display device according to an embodiment of the present disclosure.
Figure 24:
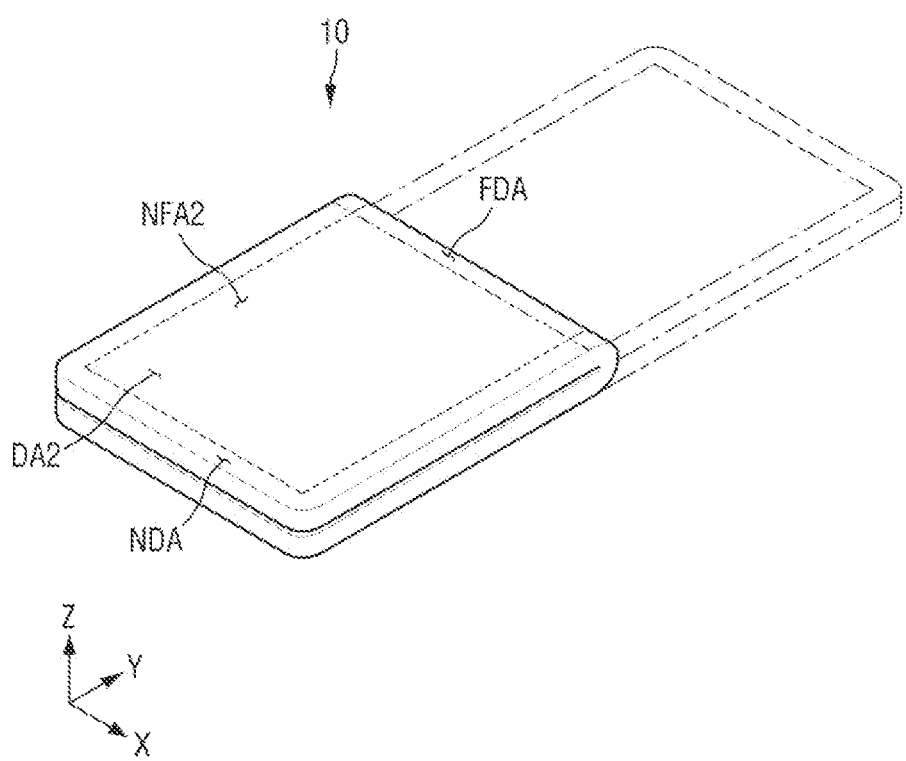

FIGS. 23 and 24 are perspective views illustrating a display device according to still an embodiment of the present disclosure.

In FIGS. 23 and 24, the display device 10 is illustrated as a foldable display device that is folded in the second direction (Y-axis direction). The display device 10 may maintain both a folded state and an unfolded state. The display device 10 may be folded in an in-folding manner in which its front surface is disposed inside. When the display device 10 is bent or folded in the in-folding manner, portions of the front surface of the display device 10 may face each other. Alternatively, the display device 10 may be folded in an out-folding manner in which its front surface is disposed outside. When the display device 10 is bent or folded in the out-folding manner, portions of a rear surface of the display device 10 may face each other.

The display device 10 may include a folding area FDA, a first non-folding area NFA1, and a second non-folding area NFA2. The folding area FDA may be an area where the display device 10 is folded, and the first non-folding area NFA1 and the second non-folding area NFA2 may be areas where the display device 10 is not folded. The first non-folding area NFA1 may be disposed on a side, e.g., a lower side of the folding area FDA. The second non-folding area NFA2 may be disposed on the other side, e.g., an upper side of the folding area FDA.

A touch detecting unit TSU according to an embodiment of the present specification may be formed and disposed in each of the first non-folding area NFA1 and the second non-folding area NFA2.

On the other hand, the folding area FDA may be an area that is bent with a predetermined curvature along a first folding line FOL1 and a second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

The first folding line FOL1 and the second folding line FOL2 may extend in the first direction (X-axis direction) as illustrated in FIGS. 23 and 24, and the display device 10 may be folded in the second direction (Y-axis direction). Therefore, since a length of the display device 10 in the second direction (Y-axis direction) can be reduced to about half, a user can easily carry the display device 10.

The first folding line FOL1 and the second folding line FOL2 may not necessarily extend in the first direction (X-axis direction). For example, the first folding line FOL1 and the second folding line FOL2 may extend in the second direction (Y-axis direction), and the display device 10 may be folded in the first direction (X-axis direction). In this case, a length of the display device 10 in the first direction (X-axis direction) may be reduced to about half. Alternatively, the first folding line FOL1 and the second folding line FOL2 may extend in a diagonal direction of the display device 10 between the first direction (X-axis direction) and the second direction (Y-axis direction). In this case, the display device 10 may be folded in a triangular shape.

When the first folding line FOL1 and the second folding line FOL2 extend in the first direction (X-axis direction) as illustrated in FIGS. 23 and 24, a length of the folding area FDA may be smaller in the second direction (Y-axis direction) than in the first direction (X-axis direction). In addition, a length of the first non-folding area NFA1 in the second direction (Y-axis direction) may be greater than the length of the folding area FDA in the second direction (Y-axis direction). A length of the second non-folding area NFA2 in the second direction (Y-axis direction) may be greater than the length of the folding area FDA in the second direction (Y-axis direction).

A first display area DA1 may be disposed on the front surface of the display device 10. The first display area DA1 may overlap the folding area FDA, the first non-folding area NFA1, and the second non-folding area NFA2. Therefore, when the display device 10 is unfolded, an image may be displayed in the forward direction on the folding area FDA, the first non-folding area NFA1, and the second non-folding area NFA2 of the display device 10.

A second display area DA2 may be disposed on the rear surface of the display device 10. The second display area DA2 may overlap the second non-folding area NFA2. Therefore, when the display device 10 is folded, an image may be displayed in the forward direction on the second non-folding area NFA2 of the display device 10.

Although a through hole TH in which a camera SDA or the like is placed is disposed in the second non-folding area NFA2 in FIGS. 23 and 24, the present disclosure is not limited thereto. The through hole TH may also be disposed in the first non-folding area NFA1 or the folding area FDA.

In concluding the detailed description, those skilled in the art will appreciate that many variations and modifications can be made to the embodiments without substantially departing from the principles of the present invention. Therefore, the disclosed embodiments of the invention are used in a generic and descriptive sense only and not for purposes of limitation.

The invention claimed is:

1. A touch detection module comprising:
a plurality of driving electrodes arranged in parallel in a touch sensing area;
a plurality of sensing electrodes crossing the plurality of driving electrodes;
a plurality of driving lines arranged in a touch peripheral area surrounding the touch sensing area to supply a touch driving signal to the plurality of driving electrodes;
a plurality of sensing lines arranged in the touch peripheral area to transmit sensing signals from the plurality of sensing electrodes;
a pad unit disposed in a subsidiary area extending from the touch peripheral area; and
a plurality of through holes formed in the touch peripheral area,
wherein the plurality of sensing lines extend along a first side of the touch peripheral area and extend along a lower side of the touch sensing area,
wherein the lower side of the touch sensing area is adjacent to the subsidiary area,
wherein the plurality of through holes are disposed in spaces between two adjacent sensing lines of the plurality of sensing lines that are disposed in the subsidiary area,
wherein the plurality of through holes are disposed in a region between a first portion of the touch peripheral area and the pad unit, and
wherein the plurality of through holes are disposed in spaces between two adjacent driving lines of the plurality of driving lines.

2. The touch detection module of claim 1, further comprising:
a first touch insulating layer disposed in the touch peripheral area and the subsidiary area extending from the touch peripheral area, wherein the first portion of the touch peripheral area is disposed between the subsidiary area and the touch sensing area; and
a second touch insulating layer disposed on the first touch insulating layer and disposed in the touch peripheral area and the subsidiary area,
wherein the plurality of sensing lines are disposed at a first sensing line distance on at least one of the first touch insulating layer and the second touch insulating layer in the touch peripheral area and the subsidiary area,
wherein the plurality of driving lines are disposed at a first driving line distance on at least one of the first touch insulating layer and the second touch insulating layer in the touch peripheral area and the subsidiary area, and
wherein the plurality of through holes are formed to penetrate the second touch insulating layer.

3. The touch detection module of claim 2,
wherein the second touch insulating layer is formed of an organic insulating layer including at least one of organic material among an acryl resin, an epoxy resin, a phenolic resin, a polyamide resin, a polyimide resin, a methacrylic resin, a polyisoprene, a vinyl resin, a urethane resin, a cellulose resin, a siloxane resin, a perylene resin, and a zirconia.

4. The touch detection module of claim 3,
wherein at least one of a height and a width of the second touch insulating layer is greater than a corresponding one of a height and a width of the first touch insulating layer, and
wherein the first touch insulating layer includes at least one inorganic material layer among a silicon nitride layer, a silicon oxynitride layer, a silicon oxide layer, titanium oxide layer, and an aluminum oxide layer.

5. The touch detection module of claim 1,
wherein the plurality of driving lines extend along a second side, opposite to the first side, of the touch peripheral area, and
wherein the spaces between the two adjacent driving lines of the plurality of driving lines are disposed in the subsidiary area.

6. The touch detection module of claim 2,
wherein the first driving line distance and the first sensing line distance are the same, and
wherein the first driving line distance is greater than a width of each driving line of the plurality of driving lines.

7. The touch detection module of claim 5,
wherein the plurality of through holes include:
two first through holes spaced apart from each other at a first interval in a first direction; and
two second through holes spaced apart from each other at a second interval in a second direction different from the first direction,
wherein at least one of the plurality of driving lines and sensing lines is interposed in a space between the two first through holes,
wherein the two second through holes are disposed in a space between adjacent two lines among the plurality of driving lines and sensing lines, and
wherein the first interval and the second interval are the same.

8. The touch detection module of claim 2,
wherein the first driving line distance and the first sensing line distance are the same, and
wherein a width or an inner diameter of each of the plurality of through holes is narrower than the first driving line distance.

9. The touch detection module of claim 5,
wherein a width or an inner diameter of each of the plurality of through holes is the same as a width of each of the plurality of driving lines or a width of each of the plurality of sensing lines.

10. The touch detection module of claim 5,
wherein the plurality of through holes includes:
two first through holes spaced apart from each other at a first interval in a first direction; and
two second through holes spaced apart from each other at a second interval in a second direction different from the first direction,
wherein at least two lines among the plurality of driving lines and sensing lines are interposed between the two first through holes,
wherein the two second through holes are disposed in a space between two adjacent lines among the plurality of driving lines and sensing lines, and
wherein the second interval is narrower than the first interval.

11. The touch detection module of claim 5,
wherein the plurality of through holes are disposed by a second interval between the plurality of driving lines, between the plurality of sensing lines, or between one of the plurality of driving lines and one of the plurality of sensing lines,
wherein the plurality of through holes are disposed by a third interval with at least two lines among the plurality of driving lines and sensing lines disposed therebetween, and
wherein the second interval of the plurality of through holes is formed to be wider than the third interval.

12. The touch detection module of claim 5,
wherein the plurality of through holes includes:
two first through holes spaced apart from each other at a first interval in a first direction; and
two second through holes spaced apart from each other at a second interval in a second direction different from the first direction,
wherein at least two lines among the plurality of driving lines and sensing lines are interposed between the two first through holes,
wherein the two second through holes are disposed in a space between two adjacent lines among the plurality of driving lines and sensing lines, and
wherein the second interval is wider than the first interval.

13. A display device comprising:
a display panel comprising a display area in which a plurality of pixels are arranged; and
a touch detection module disposed on a front surface of the display panel to detect a user's touch,
wherein the touch detection module comprises:
a plurality of driving electrodes arranged in parallel in a touch sensing area,
a plurality of sensing electrodes crossing the plurality of driving electrodes,
a plurality of driving lines arranged in a touch peripheral area surrounding the touch sensing area to supply a touch driving signal to the plurality of driving electrodes,
a plurality of sensing lines arranged in the touch peripheral area to transmit touch sensing signals from the plurality of sensing electrodes,
a pad unit disposed in a subsidiary area extending from the touch peripheral area;
a plurality of through holes formed in the touch peripheral area, and
a touch driving circuit receiving the touch sensing signals to detect a touch position coordinate on the display area,
wherein the plurality of sensing lines extend along a first side of the touch peripheral area and extend along a lower side of the touch sensing area,
wherein the lower side of the touch sensing area is adjacent to the subsidiary area,
wherein the plurality of through holes are disposed in spaces between two adjacent sensing lines of the plurality of sensing lines that are disposed in the subsidiary area,
wherein the plurality of through holes are disposed in a region between a first portion of the touch peripheral area and the pad unit, and wherein the plurality of through holes are disposed in spaces between two adjacent driving lines of the plurality of driving lines.

14. The display device of claim 13,
wherein the touch detection module further includes:
a first touch insulating layer disposed in the touch peripheral area and the subsidiary area extending from the touch peripheral area, wherein the first portion of the touch peripheral area is disposed between the subsidiary area and the touch sensing area; and
a second touch insulating layer disposed on the first touch insulating layer and disposed in the touch peripheral area and the subsidiary area,
wherein the plurality of sensing lines are disposed at a first sensing line distance on at least one of the first touch insulating layer and the second touch insulating layer in the touch peripheral area and the subsidiary area,
wherein the plurality of driving lines are disposed at a first driving line distance on at least one of the first touch insulating layer and the second touch insulating layer in the touch peripheral area and the subsidiary area, and
wherein the plurality of through holes penetrate the second touch insulating layer.

15. The display device of claim 13,
wherein the plurality of driving lines extend along a second side, opposite to the first side, of the touch peripheral area, and
wherein the spaces between the two adjacent driving lines of the plurality of driving lines are disposed in the subsidiary area.

16. The display device of claim 14,
wherein the first driving line distance and the first sensing line distance are the same, and
wherein the first driving line distance is greater than a width of each driving line of the plurality of driving lines.

17. An electronic device including a display device,
wherein the display device comprising:
a display panel comprising a display area in which a plurality of pixels are arranged; and
a touch detection module disposed on a front surface of the display panel to detect a user's touch,
wherein the touch detection module comprises:
a plurality of driving electrodes arranged in parallel in a touch sensing area,
a plurality of sensing electrodes crossing the plurality of driving electrodes,
a plurality of driving lines arranged in a touch peripheral area surrounding the touch sensing area to supply a touch driving signal to the plurality of driving electrodes,
a plurality of sensing lines arranged in the touch peripheral area to transmit touch sensing signals from the plurality of sensing electrodes,
a pad unit disposed in a subsidiary area extending from the touch peripheral area;
a plurality of through holes formed in the touch peripheral area, and
a touch driving circuit receiving the touch sensing signals to detect a touch position coordinate on the display area,
wherein the plurality of sensing lines extend along a first side of the touch peripheral area and extend along a lower side of the touch sensing area,
wherein the lower side of the touch sensing area is adjacent to the subsidiary area,
wherein the plurality of through holes are disposed in spaces between two adjacent sensing lines of the plurality of sensing lines that are disposed in the subsidiary area,
wherein the plurality of through holes are disposed in a region between a first portion of the touch peripheral area and the pad unit, and
wherein the plurality of through holes are disposed in spaces between two adjacent driving lines of the plurality of driving lines.

18. The electronic device of claim 17,
wherein the display device is used in at least one electronic device among a smart phone, a digital camera, a laptop computer, a navigation device, and a smart TV.

* * * * *